United States Patent
Usui et al.

(10) Patent No.: US 8,790,551 B2
(45) Date of Patent: Jul. 29, 2014

(54) ELECTROLYTE COMPOSITION, PHOTOELECTRIC CONVERSION ELEMENT USING THE SAME, AND DYE-SENSITIZED PHOTOVOLTAIC CELL

(75) Inventors: Hiroki Usui, Tokyo (JP); Nobuo Tanabe, Tokyo (JP); Hiroshi Matsui, Tokyo (JP); Tetsuya Ezure, Tokyo (JP); Shozo Yanagida, Osaka (JP)

(73) Assignee: Fujikura Ltd., Tokyo (JP)

( * ) Notice: Subject to any disclaimer, the term of this patent is extended or adjusted under 35 U.S.C. 154(b) by 72 days.

(21) Appl. No.: 12/485,464

(22) Filed: Jun. 16, 2009

(65) Prior Publication Data

US 2009/0293953 A1 Dec. 3, 2009

Related U.S. Application Data

(62) Division of application No. 10/564,314, filed as application No. PCT/JP2004/010245 on Jul. 12, 2004.

(30) Foreign Application Priority Data

Jul. 14, 2003 (JP) .................................. 2003196561
Jul. 23, 2003 (JP) .................................. 2003200626
Jul. 23, 2003 (JP) .................................. 2003200629
Oct. 6, 2003 (JP) .................................. 2003347193
Mar. 22, 2004 (JP) .................................. 2004082586
Mar. 22, 2004 (JP) .................................. 2004082934

(51) Int. Cl.
*H01G 9/032* (2006.01)
*H01B 1/16* (2006.01)
*H01L 31/00* (2006.01)

(52) U.S. Cl.
USPC ........ 252/518.1; 136/256; 252/506; 252/507; 252/509; 252/519.5; 252/520.1; 252/520.2; 252/520.5; 252/521.1; 977/700; 977/742

(58) Field of Classification Search
None
See application file for complete search history.

(56) References Cited

U.S. PATENT DOCUMENTS

| | | | |
|---|---|---|---|
| 4,189,827 A | 2/1980 | Eberhart et al. | |
| 4,927,721 A | 5/1990 | Gratzel et al. | |
| 5,128,006 A | 7/1992 | Mitchell | |
| 5,728,487 A * | 3/1998 | Gratzel et al. | 429/111 |

(Continued)

FOREIGN PATENT DOCUMENTS

AU 2003-268729 A1 5/2004
AU 2004235426 A1 11/2004

(Continued)

OTHER PUBLICATIONS

Machine translation of JP 2003-157914, Ono Michio, May 30, 2003.*

(Continued)

*Primary Examiner* — Kwang Han
(74) *Attorney, Agent, or Firm* — Sughrue Mion, PLLC

(57) ABSTRACT

An electrolyte composition containing an ionic liquid and conductive particles, an electrolyte composition containing an ionic liquid and oxide semiconductor particles and optionally containing conductive particles, and an electrolyte composition containing an ionic liquid and insulating particles are provided. Furthermore, a photoelectric conversion element comprising: a working electrode, the working electrode comprising an electrode substrate and an oxide semiconductor porous film formed on the electrode substrate and sensitized with a dye; a counter electrode disposed opposing the working electrode; and an electrolyte layer made of these electrolyte compositions is provided.

15 Claims, 1 Drawing Sheet

(56) References Cited

U.S. PATENT DOCUMENTS

| | | | |
|---|---|---|---|
| 6,301,039 | B1 | 10/2001 | Tench |
| 7,074,310 | B2 * | 7/2006 | Smalley et al. ............... 204/450 |
| 2002/0018938 | A1 | 2/2002 | Takeuchi et al. |
| 2002/0055046 | A1 * | 5/2002 | Ono et al. ..................... 429/324 |
| 2002/0085968 | A1 | 7/2002 | Smalley |
| 2003/0179537 | A1 | 9/2003 | Tanaka et al. |
| 2003/0196692 | A1 | 10/2003 | Koyanagi et al. |
| 2008/0006322 | A1 | 1/2008 | Wang et al. |

FOREIGN PATENT DOCUMENTS

| | | | |
|---|---|---|---|
| EP | 0855726 | A1 | 7/1998 |
| EP | 1551036 | A1 | 7/2005 |
| JP | 2664194 | B2 | 6/1997 |
| JP | H09-328307 | A | 12/1997 |
| JP | 11-306858 | A | 11/1999 |
| JP | 11-306859 | A | 11/1999 |
| JP | 2001-160427 | A | 6/2001 |
| JP | 2001229967 | A | 8/2001 |
| JP | 2002-184478 | A | 6/2002 |
| JP | 2003-055649 | A | 2/2003 |
| JP | 2003-157719 | A | 5/2003 |
| JP | 2003-157914 | A | 5/2003 |
| JP | 2006-525632 | A | 11/2006 |
| WO | 03/054894 | A1 | 7/2003 |
| WO | 2004-097871 | A2 | 11/2004 |

OTHER PUBLICATIONS

Wang et al., Gelation of ionic liquid-based electrolytes with silica nanoparticles for quasi-solid-state dye-sensitized solar cells, J Am Chem Soc. Feb. 5, 2003;125(5):1166-7.*

Fukushima et al; "Molecular Ordering of Organic Molten Salts Triggered by Single-Walled Carbon Nanotubes" Science, vol. 300, Jun. 27, 2003. p. 2072-2074.

Kawano et al; "Equilibrium potentials and charge transport of an I−/I3− redox couple in an ionic liquid" Chem Commun., United Kingdom, 2003. p. 330-331.

Brian O'Regan et al., "A Low-Cost, High Efficiency Solar Cell Based on Dye-Sensitized Collodial TiO2 Films," Nature, vol. 353, Oct. 24, 1991, pp. 737-740.

N. Papageorgiou, et al. "The Performance and Stability of Ambient Temperature Molten Salts for Solar Cell Applications," Journal of the Electrochemical Society, vol. 143, No. 10, Oct. 1996, pp. 3099-3108.

Machine translation of JP 2003-157914, Ono, May 30, 2003.

Peng Wang et al., "Gelation of Ionic Liquid-Based Electrolytes with Silica Nanoparticles for Quasi-Solid-State Dye-Sensitized Solar Cells", J. Am. Chem. Soc. 2003, 125, 1166-1167.

"Dispersion of Anatase in Ambient Temperature Ionic Liquids", Journal of Colloid Interface Science, vol. 242, 2001, pp. 104-105.

Office Action issued on Nov. 14, 2011 in the related U.S. Appl. No. 10/564,314.

* cited by examiner

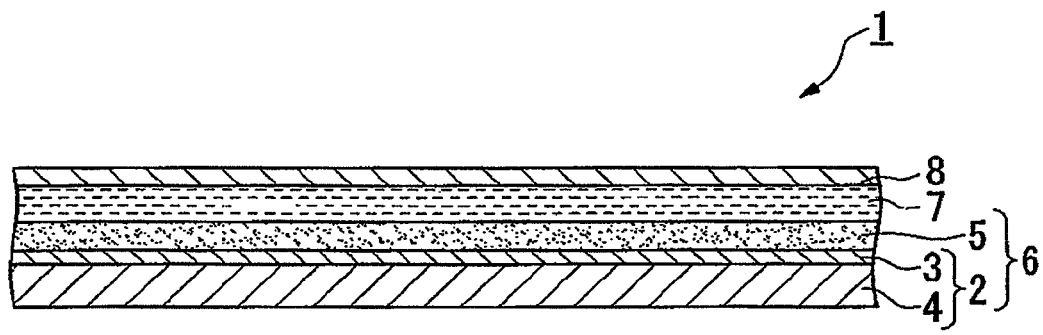

ELECTROLYTE COMPOSITION, PHOTOELECTRIC CONVERSION ELEMENT USING THE SAME, AND DYE-SENSITIZED PHOTOVOLTAIC CELL

CROSS REFERENCE TO RELATED APPLICATION

The present application is a Divisional of U.S. patent application Ser. No. 10/564,314, filed Mar. 16, 2006, which is a National Stage Entry of PCT/JP2004/010245, filed on Jul. 12, 2004 priority to PCT Application No. PCT/JP2004/010245, filed on Jul. 12, 2004. Priority is claimed on the following applications, the contents of which are incorporated herein by reference: Japanese Patent Application No. 2003-200626, filed on Jul. 23, 2003; Japanese Patent Application No. 2003-347193, filed on Oct. 6, 2003; Japanese Patent Application No. 2004-82934, filed on Mar. 22, 2004; Japanese Patent Application No. 2003-196561, filed on Jul. 14, 2003; Japanese Patent Application No. 2003-200629, filed on Jul. 23, 2003; and Japanese Patent Application No. 2004-82586, filed on Mar. 22, 2004.

TECHNICAL FIELD

The present invention relates to an electrolyte composition which is used in a photoelectric conversion element, such as a dye-sensitized photovoltaic cell, and a photoelectric conversion element using the same.

BACKGROUND ART

Dye-sensitized photovoltaic cells were developed by Graetzel et al. in Switzerland. They have advantages, such as low cost, and are attracting attention as new types of photoelectric conversion cells (see, for example, Japanese Patent No. 2664194; Japanese Unexamined Patent Application, First Publication No. 2001-160427, and Michael Graetzel, Nature, United Kingdom, 1991, vol. 353, p. 737).

Dye-sensitized photovoltaic cells generally include a transparent conductive electrode substrate, a working electrode that has a porous film made of oxide semiconductor fine particles (nanoparticles), such as titanium dioxide, and is sensitized with a photo-sensitizing dye on the electrode substrate, a counter electrode provided opposing the working electrode, and an electrolyte containing an oxidation-reduction pair filled between the working electrode and the counter electrode. Such a dye-sensitized photovoltaic cell functions as a photoelectric conversion element that converts light energy into electricity when the oxide semiconductor fine particles are sensitized by the photo-sensitizing dye that absorbs incident light, such as sunlight, thereby generating an electromotive force between the working electrode and the counter electrode.

As the electrolyte, an electrolyte solution is typically used in which an oxidation-reduction pair, such as $I^-/I_3^-$, is dissolved in an organic solvent, such as acetonitrile. Other well-known electrolytes include one using a nonvolatile ionic liquid, one in which the liquid electrolyte is made into a gel using an appropriate gelling agent to be quasi-solidified, and one using a solid semiconductor, such as a p-type semiconductor.

An ionic liquid is also called a room temperature molten salt, exists as a stable liquid in a broad temperature region, including in the vicinity of room temperature, and is a salt made from a cation and an anion. Since ionic liquids have very low vapor pressure and do not substantially vaporize at room temperature, they are not liable to volatilization or cause ignition, unlike typical organic solvents. Thus, they are proposed as a solution to a problem of decrease in cell characteristics caused by volatilization (see N. Papageorgiou et al., Journal of the Electrochemical Society (J. Electrochem. Soc.), United Kingdom, 1996, vol. 143 (10), p. 3099), for example.

In addition, when an electrolyte solution (liquid) is used as an electrolyte, the electrolyte solution may be exposed and leak (fluid leakage) during the manufacturing processes or upon breakage of the cell. In order to prevent fluid leakage, an attempt has been made to add an appropriate gelling agent (see Japanese Unexamined Patent Application, First Publication No. 2002-184478, for example).

However, ionic liquids suffer from a shortcoming in that the electrical resistance thereof is higher than that of an electrolyte solution obtained through dissolution into an organic solvent, such as acetonitrile.

In addition, gelling agents conventionally used for gel electrolytes include, for example, polyvinylidene fluoride, polyvinylidene fluoride-hexafluoropropylene copolymer, polyethylene oxide derivatives, polyacrylonitrile derivatives, amino acid derivatives. However, these gelling agents have a shortcoming in that the conversion efficiency of a photoelectric conversion element is significantly reduced compared to a case without adding such gelling agents since they are electrical insulators having very high electrical resistances.

DISCLOSURE OF INVENTION

Accordingly, a problem to be solved by the present invention is to provide an electrolyte composition that exhibits the conversion efficiency of a photoelectric conversion element comparable to that of one using liquid electrolytes (electrolyte solutions), and a photoelectric conversion element and a dye-sensitized photovoltaic cell using the same.

In order to solve the above problem, a first aspect of the present invention provides an electrolyte composition comprising an ionic liquid and conductive particles as main components. This electrolyte composition is preferably made into a gel.

In this electrolyte composition, it is preferable that the content of the conductive particles be not less than 0.05% by weight and not more than 10% by weight with respect to the ionic liquid. More preferably, it is preferable that the content of the conductive particles be not less than 0.05% by weight and not more than 10% by weight with respect to a total amount of the electrolyte composition.

As the conductive particles, a material containing carbon as a main component may be used, for example. Such conductive particles include carbon nanotubes, carbon fibers, carbon black, and the like. Such conductive particles may be one or a mixture of a plurality of members selected from the group consisting of carbon nanotubes, carbon fibers, and carbon black. As carbon nanotubes, either one of or a mixture of single-wall carbon nanotubes and multi-wall carbon nanotubes may be used.

Furthermore, the first aspect of the present invention provides a photoelectric conversion element comprising the electrolyte composition as an electrolyte.

Furthermore, the first aspect of the present invention provides a photoelectric conversion element, comprising: a working electrode, the working electrode comprising an electrode substrate and an oxide semiconductor porous film formed on the electrode substrate and sensitized with a dye; a counter electrode disposed opposing the working electrode;

and an electrolyte layer made of the above-described electrolyte composition provided between the working electrode and the counter electrode.

Furthermore, the first aspect of the present invention provides a dye-sensitized photovoltaic cell, comprising: a working electrode, the working electrode comprising an electrode substrate and an oxide semiconductor porous film formed on the electrode substrate and sensitized with a dye; a counter electrode disposed opposing the working electrode; and an electrolyte layer made of the above-described electrolyte composition provided between the working electrode and the counter electrode.

In order to solve the above problem, a second aspect of the present invention provides an electrolyte composition comprising an ionic liquid (A) and oxide semiconductor particles (B) as main components. This electrolyte composition may include conductive particles (C).

The electrolyte composition according to the second aspect of the present invention is preferably made into a gel.

In the electrolyte composition according to the second aspect of the present invention, it is preferable that the oxide semiconductor particles (B) be one member or a mixture of two or more members selected from the group consisting of $TiO_2$, $SnO_2$, $WO_3$, $ZnO$, ITO, $BaTiO_3$, $Nb_2O_5$, $In_2O_3$, $ZrO_2$, $Ta_2O_5$, $La_2O_3$, $SrTiO_3$, $Y_2O_3$, $Ho_2O_3$, $Bi_2O_3$, $CeO_2$, and $Al_2O_3$. It is preferable that the above $TiO_2$ be either one of or a mixture of titanium oxide nanotubes and titanium oxide nanoparticles.

Furthermore, it is preferable that the conductive particle be made of a material containing carbon as a main component. For example, the material containing carbon as a main component includes carbon nanotubes, carbon fibers, carbon black, and the like. In addition, it is preferable that the material containing carbon as a main component be one member or a mixture of two or more members selected from the group consisting of carbon nanotubes, carbon fibers, and carbon black. Furthermore, it is preferable that the carbon nanotubes be either one of or a mixture of single-wall carbon nanotubes and multi-wall carbon nanotubes.

In the electrolyte composition according to the second aspect of the present invention, it is preferable that, when no conductive particles (C) are added, a compounding amount of the oxide semiconductor particle (B) be no less than 0.05% by weight and no more than 70% by weight with respect to the total amount of the electrolyte composition.

It is preferable that, when conductive particles (C) are added, a total compounding amount of the oxide semiconductor particle (B) and the conductive particles (C) be no less than 0.05% by weight and no more than 70% by weight with respect to the total amount of the electrolyte composition.

In the electrolyte composition according to the second aspect of the present invention, it is preferable that, when no conductive particles (C) are added, a compounding amount of the oxide semiconductor particle (B) be no less than 0.05% by weight and no more than 70% by weight with respect to the total amount of the ionic liquid (A).

It is preferable that, when conductive particles (C) are added, a total compounding amount of the oxide semiconductor particle (B) and the conductive particles (C) be no less than 0.05% by weight and no more than 70% by weight with respect to the total amount of the ionic liquid (A).

Furthermore, the second aspect of the present invention provides a photoelectric conversion element comprising the electrolyte composition as an electrolyte.

Furthermore, the second aspect of the present invention provides a photoelectric conversion element, comprising: a working electrode, the working electrode comprising an electrode substrate and an oxide semiconductor porous film formed on the electrode substrate and sensitized with a dye; a counter electrode disposed opposing the working electrode; and an electrolyte layer made of the above-described electrolyte composition provided between the working electrode and the counter electrode.

Furthermore, the second aspect of the present invention provides a dye-sensitized photovoltaic cell, comprising: a working electrode, the working electrode comprising an electrode substrate and an oxide semiconductor porous film formed on the electrode substrate and sensitized with a dye; a counter electrode disposed opposing the working electrode; and an electrolyte layer made of the above-described electrolyte composition provided between the working electrode and the counter electrode.

According to the second aspect of the present invention, a gel electrolyte having a high conductivity can be obtained by making an ionic liquid into a gel. By using such an electrolyte composition as an electrolyte of a photoelectric conversion element, it becomes possible to stably achieve high output characteristics and photoelectric conversion characteristics. Furthermore, since the electrolyte composition is in a state of a gel, it has reduced flowability, thereby achieving excellent safety and durability and ease of handling.

In order to solve the above problem, a third aspect of the present invention provides an electrolyte composition comprising an ionic liquid (A) and insulating particles (C) as main components.

This electrolyte composition is preferably made into a gel.

In the electrolyte composition according to the third aspect of the present invention, the insulating particles (C) are one member or a mixture of two or more members selected from the group consisting of diamond and boron nitride.

In the electrolyte composition according to the third aspect of the present invention, it is preferable that a compounding amount of the conductive particles (C) be no less than 0.05% by weight and no more than 70% by weight with respect to the total amount of the electrolyte composition.

Furthermore, the third aspect of the present invention provides a photoelectric conversion element comprising the electrolyte composition as an electrolyte.

Furthermore, the third aspect of the present invention provides a photoelectric conversion element, comprising: a working electrode, the working electrode comprising an electrode substrate and an oxide semiconductor porous film formed on the electrode substrate and sensitized with a dye; a counter electrode disposed opposing the working electrode; and an electrolyte layer made of the above-described electrolyte composition provided between the working electrode and the counter electrode.

Furthermore, the third aspect of the present invention provides a dye-sensitized photovoltaic cell, comprising: a working electrode, the working electrode comprising an electrode substrate and an oxide semiconductor porous film formed on the electrode substrate and sensitized with a dye; a counter electrode disposed opposing the working electrode; and an electrolyte layer made of the above-described electrolyte composition provided between the working electrode and the counter electrode.

According to the third aspect of the present invention, a gel electrolyte having a high conductivity can be obtained by making an ionic liquid into a gel. By using such an electrolyte composition as an electrolyte of a photoelectric conversion element, it becomes possible to stably achieve high output characteristics and photoelectric conversion characteristics. Furthermore, since the electrolyte composition is in a state of a gel, it has reduced flowability, thereby achieving excellent safety and durability and ease of handling.

BRIEF DESCRIPTION OF THE DRAWINGS

FIG. 1 is a schematic diagram illustrating an example of a photoelectric conversion element according to the present invention.

BEST MODE FOR CARRYING OUT THE INVENTION

Hereinafter, preferred embodiments of the present invention will be described with reference to the drawings. However, it should not be construed that the present invention is limited to these embodiments; rather, components of these embodiments may be combined if necessary.
First Embodiment The present invention will now be described in detail based on a first embodiment of the present invention An electrolyte composition according to the first embodiment of the present invention contains an ionic liquid and conductive particles as main components.

The electrolyte composition according to the first embodiment of the present invention contains the ionic liquid as a first essential component.

An example of the ionic liquid is, but not limited to, a room temperature molten salt that is liquid at room temperature and contains a compound containing a quaternized nitrogen atom as a cation. The cation of the room temperature molten salt may be quaternary imidazolium derivatives, quaternary pyridinium derivatives, quaternary ammonium derivatives, and the like. The anion of the room temperature molten salt may be $BF_4^-$, $PF_6^-$, $F(HF)_n^-$, bis(trifluoromethylsulfonyl)imide $[N(CF_3SO_2)_2^-]$, iodide ions, and the like.

Specific examples of the ionic liquid may include salts made of a quaternary imidazolium cation, and iodide ion or bis(trifluoromethylsulfonyl)imide ion, and the like.

The electrolyte composition according to the first embodiment of the present invention contains the conductive particles as a second essential component.

As the conductive particles, particles having conductivity, such as those made of a conductor or a semiconductor may be used. The range of the specific resistance of the conductive particles is preferably $1.0 \times 10^{-2}$ Ω·cm or less, and more preferably $1.0 \times 10^{-3}$ Ω·cm or less.

Types of the material of the conductive particles and the particle size thereof are not limited, but those that exhibit a miscibility with the electrolyte solution, which contains an ionic liquid as a main component, and can make the electrolyte solution into a gel are preferred. As used herein, an electrolyte is regarded as a gel if all of 10 cc of the electrolyte that is placed into a columnar glass tube having an inner diameter of 15 mm and a depth of 10 cm does not fall to the bottom after 15 minutes at room temperature (23° C.) when the glass tube is turned upside down. In addition, the conductive particles should not cause a decrease in the conductivity due to formation of an oxide film (insulating film) or the like in the electrolyte composition, and should exhibit chemical stability to other co-existing components contained in the electrolyte composition. Especially, it is preferable that the conductive particles be not degraded by an oxidation reaction even when the electrolyte composition contains an oxidation-reduction pair, such as iodine/iodide ion or bromine/bromide ion.

Such conductive particles may be particles including carbon as a main component, and specific examples include particles, such as carbon nanotubes, carbon fibers, carbon black, and the like. Methods for manufacturing such materials are well-known; alternatively, commercially available materials may be used.

Carbon nanotubes have a structure in which a graphene sheet is formed into a columnar or a truncated cone shape. More specifically, there are single-wall carbon nanotubes (SWCNT) having a single layer of a graphene sheet and multi-wall carbon nanotubes (MWCNT) having multiple layers (two or more layers) of graphene sheets.

These materials have an excellent stability against an oxidizing agent that may be used in an oxidation-reduction pair, such as iodine or bromine, and can be preferably used as conductive particles in the electrolyte composition of the present invention.

The above-described conductive particles may be used either alone or in combination of two or more kinds.

The size of the above-described particles is preferably between about 0.5 nm and 10 nm in diameter and between about 10 nm to 1 μm in length for single-wall carbon nanotubes. For multi-wall carbon nanotubes, those having a diameter of between about 1 nm and 100 nm and a length of between about 50 nm to 50 μm are preferable. For carbon fibers, those having a diameter of between about 50 nm and 1 μm and a length of between about 1 μm to 100 μm are preferable. For carbon black, those having a particle diameter of between about 1 nm and 500 nm are preferable.

It is preferable that the content of the conductive particles be not less than 0.05% by weight and not more than 10% by weight with respect to the ionic liquid. It is preferable that the more preferable content of the conductive particles be within not less than 0.05% by weight and not more than 10% by weight with respect to the total amount of the electrolyte composition. This range can enable the electrolyte solution containing the ionic liquid to form a gel, and the electrolyte solution is prevented from being exposed and leaking (fluid leakage) during the manufacturing processes or upon breakage of the cell.

If the content of the conductive particles is less than 0.05% by weight with respect to the total amount of the electrolyte composition, the electrolyte solution containing the ionic liquid does not form a gel and fluid leakage or the like may occur upon breakage. If the content of the conductive particles exceeds 10% by weight with respect to the total amount of the electrolyte composition, the conductive particles absorb all of the electrolyte solution containing the ionic liquid and the solution may not function as an electrolyte. A more preferable content of the conductive particles is about 1% by weight with respect to the total amount of the electrolyte composition.

Oxidation-reduction pairs (redox pairs) may be added to the electrolyte composition according to the first embodiment of the present invention, although they are not an essential component. It is preferable to add an oxidation-reduction pair when the electrolyte composition is used in a dye-sensitized photovoltaic cell or the like.

The oxidation-reduction pair is not particularly limited. For example, pairs such as iodine/iodide ions, bromine/bromide ions, and the like may be added and obtained. For the supply source of the iodide ions or bromide ions, a lithium salt, quaternary imidazolium salt, tetrabutylammonium salt, and the like may be used alone or in combination.

Examples of the organic solvent to which the oxidation-reduction pair is dissolved include acetonitrile, methoxy acetonitrile, propionitrile, ethylene carbonate, propylene carbonate, diethyl carbonate, γ-butyrolactone, and the like.

Various additives or solvents, such as tert-butylpyridine, may be added to the electrolyte composition according to the first embodiment of the present invention if required, in an amount in which the properties or characteristics of the electrolyte composition are not affected.

The methods for preparing the electrolyte composition of the present invention from the components described above are not particularly limited, and a method may be employed, for example, in which an electrolyte solution is obtained by adding additives, such as an oxidation-reduction pair, to an ionic liquid and uniformly blending the above-described conductive particles into the electrolyte solution. For blending the electrolyte solution and the conductive particles, any of appropriate well-known agitators, mixers, or centrifugal separators may be used. For obtaining the electrolyte composition in a gel state, the conductive particles may be blended in a content suitable to make the electrolyte solution into a gel.

The electrolyte composition according to the first embodiment of the present invention may be preferably used for a photoelectric conversion element, such as a dye-sensitized photovoltaic cell, for example.

Since the conductive particles can contribute to charge transfer in the electrolyte composition according to the first embodiment of the present invention, the electrical resistance is lower than that of an ionic liquid and accordingly an electrolyte composition obtained therefrom exhibits good conductivity. As a result, the conversion efficiency of a photoelectric conversion element or the like can be increased when compared to the case where an ionic liquid is used as the electrolyte.

Furthermore, when the electrolyte composition according to the first embodiment of the present invention is made into a gel, the following excellent advantageous effects are achieved.

In the case of a gelling agent that is typically used in a conventional gel electrolyte, such as polymers, the electrical resistance is high. Thus, there is a problem in that the conductivity of the electrolyte is reduced when it is made into a gel, and photoelectric conversion characteristics of a photoelectric conversion element are deteriorated. In contrast, in the electrolyte composition of the present invention, since the conductive particles can contribute to charge transfer and the electrolyte solution is made into a gel by the conductive particles, a gel electrolyte composition obtained through gelling exhibits good conductivity and photoelectric conversion characteristics comparable to those when using a liquid electrolyte. In addition, since the electrolyte is made into a gel, the electrolyte composition is prevented from being exposed and leaking (fluid leakage) during the manufacturing processes or upon breakage of the cell, providing good productivity and easy handling.

Next, a photoelectric conversion element using the electrolyte composition according to the first embodiment of the present invention will be explained. FIG. 1 is a cross-sectional view showing an example of a schematic structure of a dye-sensitized photovoltaic cell, as an embodiment of the photoelectric conversion element of the present invention.

A dye-sensitized photovoltaic cell 1 includes a transparent electrode substrate 2, a working electrode 6 having an oxide semiconductive porous film 5 made of oxide semiconductive fine particles formed on the transparent electrode substrate 2 and sensitized with a photo-sensitizing dye, and a counter electrode 8 provided opposing the working electrode 6. An electrolyte layer 7 that is made of the above-described electrolyte composition is provided between the working electrode 6 and the counter electrode 8.

The transparent electrode substrate 2 is made by forming a conductive layer 3 made of a conductive material on a transparent base material 4, such as a glass plate or a plastic sheet.

The transparent base material 4 is preferably made of a material having excellent optical transparent properties when taking its function into consideration. Other than a glass, transparent plastic sheets made of polyethylene terephthalate (PET), polyethylene naphthalate (PEN), polycarbonate (PC), polyether sulfone (PES), or the like; a polished plate of a ceramic, such as titanium oxide, alumina, or the like, may be used.

For the conductive layer 3, it is preferable that transparent oxide semiconductors, such as tin-doped indium oxide (ITO), tin oxide ($SnO_2$), fluorine-doped tin oxide (FTO), or the like, be used either alone or in a mixture of two or more thereof when taking the light transmittance of the transparent electrode substrate 2 into consideration. However, these materials are not limiting, and any suitable material having light transmittance and conductivity appropriate for an intended purpose may be used. Furthermore, in order to improve the current collecting efficiency from the oxide semiconductor porous film 5 or the electrolyte layer 7, a metal wiring layer made of gold, silver, platinum, aluminum, nickel, titanium, or the like, may be used provided that an area ratio of the metal wiring layer is within the range that does not significantly reduce the light transmittance of the transparent electrode substrate 2. When such a metal wiring layer is used, the metal wiring layer may be provided as a grid-like, stripe-like, or comb-like pattern so that light transmits through the transparent electrode substrate 2 as evenly as possible.

The method used to form the conductive layer 3 is not particularly limited, and examples thereof include thin film formation methods, such as a sputtering method, or a CVD method, or a spray decomposition method (SPD), or an evaporation method, when the conductive layer 3 is formed from ITO. The conductive layer 3 is formed to a thickness of between about 0.05 μm and 2.0 μm considering the optical transparent properties and the conductivity.

The oxide semiconductor porous film 5 is a porous thin layer with a thickness between about 0.5 and 50 μm containing as a main component oxide semiconductor fine particles that are made of titanium oxide ($TiO_2$), tin oxide ($SnO_2$), tungsten oxide ($WO_3$), zinc oxide (ZnO), and niobium oxide ($Nb_2O_5$), used either alone or in a combination of two or more materials, and have an average particle diameter between 1 nm to 1000 nm.

The oxide semiconductor porous film 5 can be formed, for example, by employing methods such as a method in which a dispersion solution obtained by dispersing commercially available oxide semiconductor fine particles in a desired dispersion medium is coated, or a colloidal solution that can be prepared using a sol-gel method is coated, after desired additives have been added thereto if these are required, using a known coating method such as a screen printing method, an inkjet printing method, a roll coating method, a doctor blade method, a spin coating method, a spray coating method, or the like. Other methods include: a electrophoretic deposition method in which the electrode substrate 2 is immersed in a colloidal solution and oxide semiconductor fine particles are made to adhere to the electrode substrate 2 by electrophoresis; a method in which a foaming agent is mixed in a colloidal solution or dispersion solution which is then coated and baked so as to form a porous material; and a method in which polymer microbeads are mixed together and coated on, and these polymer microbeads are then removed by thermal treatment or chemical treatment, so as to define spaces and thereby form a porous material.

The sensitizing dye that is provided in the oxide semiconductor porous film 5 is not particularly limited, and it is possible to use ruthenium complexes or iron complexes containing a ligand having bipyridine structures, terpyridine structures, and the like; metal complexes such as porphyrin and phthalocyanine; as well as organic dyes such as eosin, rhodamine, melocyanine, and coumarin. The dye can be selected according to the application and the material used for the oxide semiconductor porous film.

The counter electrode 8 may be one obtained by forming a thin film made of a conductive oxide semiconductor, such as ITO, FTO, or the like, on a substrate made of a non-conductive material, such as a glass, or one obtained by forming an electrode by evaporating or applying a conductive material, such as gold, platinum, a carbon-based material, and the like, on a substrate. Furthermore, the counter electrode 8 may be one obtained by forming a layer of platinum, carbon, or the like, on a thin film of a conductive oxide semiconductor, such as ITO, FTO, or the like.

A method for forming the counter electrode 8 includes, forming a platinum layer by applying chloroplatinate and then performing a heat treatment, for example. Alternatively, a method may be used in which the electrode is formed on a substrate by an evaporation technique or sputtering technique.

The method for forming the electrolyte layer 7 made of the above-described electrolyte composition on the working electrode 6 is not particularly limited, and a method may be employed in which the electrolyte composition is dropped on the working electrode 6 in a small amount. By this, it is possible to make the electrolyte composition infiltrate into the spaces in the oxide semiconductor porous film 5 when the electrolyte composition is cast onto the working electrode 6.

Since the electrolyte composition is in a state of a gel in the photoelectric conversion element of the present invention that can be obtained with the above-described procedures, it has reduced volatility and flowability. Thus, degradation or loss of the electrolyte due to vaporization of the solvent or the like does not occur, and it becomes possible to stably achieve high output characteristics and photoelectric conversion characteristics. Furthermore, leakage of the electrolyte from the gap of a container or scattering thereof upon breakage of a photoelectric conversion element are prevented, providing better safety, durability, and the like compared to the cases where a liquid electrolyte solution is used.

Hereinafter, examples of the first embodiment of the present invention will be explained.

<Preparation of Electrolyte Composition>

As an ionic liquid, 1-ethyl-3-methylimidazolium bis(trifluoromethylsulfonyl)imide was used, and an electrolyte solution containing iodine/iodide ions as an oxidation-reduction pair was prepared by dissolving appropriate amounts of iodine and lithium iodide, and an appropriate amount of 4-tert-butylpyridine into this ionic liquid.

Electrolyte compositions of Examples A-1 to A-10 were obtained by blending carbon nanotubes, or carbon fibers, or carbon black as conductive particles in the above electrolyte solution at a ratio of 1% by weight with respect to the total amount of the electrolyte composition and then centrifuging the mixture. In this case, the compounding amount of the conductive particles with respect to the ionic liquid was about 1.25% by weight.

<Fabrication of Photoelectric Conversion Element of Examples A1-1 to A1-5, A2, and A3>

As a transparent electrode substrate, a 100 mm×100 mm glass substrate having an FTO film formed thereon was provided, and a slurry dispersion solution of titanium oxide having an average particle diameter of 20 nm was applied on the FTO film (conductive layer) side surface of this transparent electrode substrate 2. After being dried, an oxide semiconductor porous film having a thickness of 7 μm was obtained by performing heating treatment at 450° C. for one hour. The transparent electrode substrate was then immersed overnight in an ethanol solution of ruthenium bipyridine complex (an N3 dye) so as to be sensitized with the dye to form a working electrode. Furthermore, as a counter electrode, an FTO glass electrode substrate was prepared having an electrode layer made of platinum formed thereon by sputtering.

In order to form the electrolyte layer on the working electrode, the electrolyte composition that was made into a gel was dropped to the oxide semiconductor porous film of the working electrode in a small amount, and then the counter electrode and the electrolyte layer were adhered together by overlaying them while pressing the counter electrode hard. In the procedures described above, dye-sensitized photovoltaic cells which were test cells of Examples A1-1 to A1-5, A2, and A3 were fabricated.

<Fabrication of Test Cell of Comparative Example A1>

As the working electrode and the counter electrode, electrodes similar to those used in the above-described test cells of Examples A1-1 to A1-5, A2, and A3 were used. As an electrolyte solution to form an electrolyte, an ionic liquid [1-ethyl-3-methylimidazolium bis(trifluoromethylsulfonyl)imide] containing iodine/iodide ions as an oxidation-reduction pair was prepared and used. This electrolyte solution was similar to those used to prepare the electrolyte solutions for the electrolyte compositions of the test cells of Examples A1-1 to A1-5, A2, and A3, except that conductive particles were not added.

A dye-sensitized photovoltaic cell which was the test cell of Comparative Example A1 was fabricated by placing the working electrode and the counter electrode so that they opposed each other and forming an electrolyte layer by injecting the electrolyte solution therebetween.

<Fabrication of Test Cell of Comparative Example A2>

As the working electrode and the counter electrode, electrodes similar to those used in the above-described test cells of Examples A1-1 to A1-5, A2, and A3 were used. As an electrolyte solution to form an electrolyte, an acetonitrile solution containing quaternary imidazolium-iodide, lithium iodide, iodine, and 4-tert-butylpyridine was prepared and used.

A dye-sensitized photovoltaic cell which was the test cell of Comparative Example A2 was fabricated by placing the working electrode and the counter electrode so that they opposed each other and forming an electrolyte layer by injecting the electrolyte solution therebetween.

<Photoelectric Conversion Characteristic of Test Cells>

Photoelectric conversion characteristics of each of the above-described test cells were measured. The conversion efficiency of each of the test cells is listed in Table 1. In Table 1, the column under the label "SWCNT/MWCNT" indicates a ratio of single-wall carbon nanotubes (SWCNT) and multi-wall carbon nanotubes (MWCNT).

TABLE 1

| | Conductive Particles | SWCNT/ MWCNT | State | Conversion Efficiency [%] |
|---|---|---|---|---|
| Example A1-1 | Carbon nanotubes | 100%/0% | gel | 4.4 |
| Example A1-2 | Carbon nanotubes | 80%/20% | gel | 4.4 |
| Example A1-3 | Carbon nanotubes | 50%/50% | gel | 4.5 |
| Example A1-4 | Carbon nanotubes | 20%/80% | gel | 4.3 |
| Example A1-5 | Carbon nanotubes | 0%/100% | gel | 4.7 |
| Example A2 | Carbon fibers | — | gel | 4.4 |
| Example A3 | Carbon black | — | gel | 4.3 |

TABLE 1-continued

| | Conductive Particles | SWCNT/ MWCNT | State | Conversion Efficiency [%] |
|---|---|---|---|---|
| Comparative Example A1 | none | — | liquid | 4.1 |
| Comparative Example A2 | none (acetonitrile solution) | — | liquid | 5.5 |

As shown by the above results, high conversion efficiencies that were comparable to conversion efficiencies achievable when a liquid electrolyte (an electrolyte solution) is used were obtained even when the electrolyte was in a state of a gel in the test cells of Examples A1-1 to A1-5, A2, and A3. Japanese Unexamined Patent Application, First Publication No. 2002-184478 discloses a conversion efficiency of a photoelectric conversion element at an early stage of 2.0% when an electrolyte was made into a gel. As in this case, conventionally, conversion efficiencies when a gel electrolyte is used have been significantly lower than those when an electrolyte solution is used, which did not occur in the present invention. Accordingly, advantageous effects of making an electrolyte solution (an ionic liquid or the like) into a gel using conductive particles are apparent.

According to the first embodiment of the present invention, it is possible to obtain an electrolyte having a better conductivity by improving the properties of an ionic liquid. Furthermore, it is possible to obtain a gel electrolyte having a high conductivity by making an electrolyte composition containing an ionic liquid into a gel.

By using such an electrolyte composition as an electrolyte of a photoelectric conversion element, it becomes possible to stably achieve high output characteristics and photoelectric conversion characteristics. Furthermore, since the electrolyte composition is in a state of a gel, it has reduced flowability, thereby achieving excellent safety and durability and ease of handling.

Second Embodiment

The present invention will now be described in detail based on a second embodiment of the present invention An electrolyte composition according to the second embodiment of the present invention contains an ionic liquid (A) and oxide semiconductor particles (B), or an ionic liquid (A), oxide semiconductor particles (B), and conductive particles (C). Furthermore, in a preferred embodiment, the electrolyte composition of the present invention is made into a gel. As used herein, an electrolyte is regarded as a gel if all of 10 cc of the electrolyte that is placed into a columnar glass tube having an inner diameter of 15 mm and a depth of 10 cm does not fall to the bottom after 15 minutes at room temperature (23° C.) when the glass tube is turned upside down.

The electrolyte composition according to the second embodiment of the present invention contains the ionic liquid (A) as a first essential component.

An example of the ionic liquid (A) is, but not limited to, a room temperature molten salt that is liquid at room temperature and contains a compound containing a quaternized nitrogen atom as a cation. The cation of the room temperature molten salt may be quaternary imidazolium derivatives, quaternary pyridinium derivatives, quaternary pyrrolidinium derivatives, quaternary ammonium derivatives, and the like.

As quaternary imidazolium-based cations, 1,3-dialkyl imidazoliums, such as, 1-ethyl-3-methylimidazolium, 1-ethyl-3-propyl imidazolium, 1-ethyl-3-hexyl imidazolium, 1-hexyl-3-methylimidazolium, are exemplified, for example. As quaternary pyridinium-based cations, N-alkyl pyridiniums, such as N-butyl pyridinium, are exemplified, for example. As quaternary pyrrolidinium-based cations, N,N-dialkyl pyrrolidiniums, such as N-methyl-N-propyl pyrrolidinium and N-methyl-N-butyl pyrrolidinium, are exemplified.

The anion of the room temperature molten salt may be $BF_4^-$, $PF_6^-$, $F(HF)_n^-$, bis(trifluoromethylsulfonyl)imide $[N(CF_3SO_2)_2^-]$, iodide ions, bromide ions, dicyanamide, and the like.

Specific examples of the ionic liquid may include salts made of a quaternary imidazolium cation, and iodide ion or bis(trifluoromethylsulfonyl)imide ion, dicyanamide ion, and the like.

The electrolyte composition according to the second embodiment of the present invention contains the oxide semiconductor particles (B) as a second essential component.

Types of the material of the oxide semiconductor particles (B) and the particle size thereof are not limited, but those that exhibit a miscibility with the electrolyte solution, which contains an ionic liquid as a main component, and can make the electrolyte solution into a gel are preferred. In addition, the conductive particles should not cause a decrease in the conductivity in the electrolyte composition, and exhibit chemical stability to other co-existing components contained in the electrolyte composition. Especially, it is preferable that the conductive particles be not degraded by an oxidation reaction even when the electrolyte composition contains an oxidation-reduction pair, such as iodine/iodide ion or bromine/bromide ion.

Such oxide semiconductor particles (B) are preferably one of the member or a mixture of two or more members selected from the group consisting of $TiO_2$, $SnO_2$, $WO_3$, $ZnO$, $ITO$, $BaTiO_3$, $Nb_2O_5$, $In_2O_3$, $ZrO_2$, $Ta_2O_5$, $La_2O_3$, $SrTiO_3$, $Y_2O_3$, $Ho_2O_3$, $Bi_2O_3$, $CeO_2$, and $Al_2O_3$. As used herein, "ITO" means tin-doped indium oxide. The oxide semiconductor used for the oxide semiconductor particles (B) may be an oxide doped with dopants, or may be a composite oxide.

Titanium dioxide fine particles (nanoparticles or nanotubes) are particularly preferred as the oxide semiconductor particles (B).

The average particle diameter of the oxide semiconductor particles (B) is preferably between about 2 nm and 1000 nm. The average particle diameter of titanium dioxide nanoparticles is preferably between about 1 nm and 1 μm.

Titanium dioxide nanotubes are tube-shaped titanium oxides having a diameter of between about 5 nm and 20 nm and a length of between about 10 nm and 10 μm.

In the electrolyte composition according to the second embodiment of the present invention, the conductive particles (C) may be blended as an optional component.

As the conductive particles (C), particles having conductivity, such as those made of a conductor or a semiconductor may be used.

The range of the specific resistance of the conductive particles is preferably $1.0 \times 10^{-2}$ Ω·cm or less, and more preferably $1.0 \times 10^{-3}$ Ω·cm or less.

Types of the material of the conductive particles (C) and the particle size thereof are not limited, but those that exhibit a miscibility with the electrolyte solution, which contains an ionic liquid as a main component, and can make the electrolyte solution into a gel are preferred. In addition, the conductive particles should not cause a decrease in the conductivity due to formation of an oxide film (insulating film) or the like in the electrolyte composition, and should exhibit chemical stability to other co-existing components contained in the electrolyte composition. Especially, it is preferable that the conductive particles be not degraded by an oxidation reaction even when the electrolyte composition contains an oxidation-reduction pair, such as iodine/iodide ion or bromine/bromide ion.

Such conductive particles (C) may be particles including carbon as a main component, and specific examples include particles, such as carbon nanotubes, carbon fibers, carbon black, and the like. Methods for manufacturing such materials are well-known; alternatively, commercially available materials may be used.

Carbon nanotubes have a structure in which a graphene sheet is formed into a columnar or a truncated cone shape. More specifically, there are single-wall carbon nanotubes (SWCNT) having a single layer of a graphene sheet and multi-wall carbon nanotubes (MWCNT) having multiple layers (two or more layers) of graphene sheets.

These materials have an excellent stability against an oxidizing agent that may be used in an oxidation-reduction pair, such as iodine or bromine, and can be preferably used as conductive particles (C) in the electrolyte composition of the present invention.

The above-described conductive particles (C) may be used either alone or in combination of two or more kinds.

The size of each of the above-described particles is preferably between about 0.5 nm and 10 nm in diameter and between about 10 nm to 1 µm in length for single-wall carbon nanotubes. For multi-wall carbon nanotubes, those having a diameter of between about 1 nm and 100 nm and a length of between about 50 nm to 50 µm are preferable. For carbon fibers, those having a diameter of between about 50 nm and 1 µm and a length of between about 1 µm to 100 µm are preferable. For carbon black, those having a particle diameter of between about 1 nm and 500 nm are preferable.

It is preferable that, when no conductive particles (C) are added, the compounding amount of the oxide semiconductor particles (B) be no less than 0.05% by weight and no more than 70% by weight with respect to the total amount of the electrolyte composition. More preferably, it is preferable that it be no less than 0.05% by weight and no more than 50% by weight.

It is preferable that, when conductive particles (C) are added, the total compounding amount of the oxide semiconductor particles (B) and the conductive particles (C) be no less than 0.05% by weight and no more than 70% by weight with respect to the total amount of the electrolyte composition. More preferably, it is preferable that it be no less than 0.05% by weight and no more than 50% by weight.

Setting the compounding amount of the oxide semiconductor particles (B) and the conductive particle (C) within the above range can enable the electrolyte solution containing the ionic liquid (A) to form a gel, and the electrolyte solution is prevented from being exposed and leaking (fluid leakage) during the manufacturing processes or upon breakage of the cell.

If the compounding amount of the oxide semiconductor particles (B) or the total compounding amount of the oxide semiconductor particles (B) and the conductive particles is less than 0.05% by weight with respect to the total amount of the electrolyte composition, the electrolyte solution containing the ionic liquid does not form a gel and fluid leakage or the like may occur upon breakage. In contrast, when the compounding amount of the oxide semiconductor particles (B) or the total compounding amount of the oxide semiconductor particles (B) and the conductive particles (C) exceeds 70% by weight with respect to the total amount of the electrolyte composition, the particles (B) or the particles (B) and (C) absorb all of the ionic liquid and the solution may not function as an electrolyte.

When the oxide semiconductor particles (B) are nanoparticles, a preferred compounding amount of (B) or (B)+(C) described above is no less than 0.05% by weight and no more than 70% by weight. Furthermore, a more preferred compounding amount of (B) or (B)+(C) described above is no less than 0.05% by weight and no more than 50% by weight with respect to the total amount of the electrolyte composition.

When the oxide semiconductor particles (B) are nanotubes, a preferred compounding amount of (B) or (B)+(C) described above is no less than 0.05% by weight and no more than 50% by weight. Furthermore, a more preferred compounding amount of (B) or (B)+(C) described above is about 10% by weight with respect to the total amount of the electrolyte composition.

Oxidation-reduction pairs (redox pairs) may be added to the electrolyte composition according to the second embodiment of the present invention, although they are not an essential component. It is preferable to add an oxidation-reduction pair when the electrolyte composition is used in a dye-sensitized photovoltaic cell or the like.

As the oxidation-reduction pair, a halogen-based redox pair made of halide ions, such as iodide ions ($I^-$), bromide ions ($Br^-$), or chloride ions ($Cl^-$), or polyhalide ions, such as $I_3^-$, $I_5^-$, $I_7^-$, $Br_3^-$, $Cl_2I^-$, $ClI_2^-$, $Br_2I^-$, $BrI_2^-$, is preferably used, although these are not limiting.

For example, pairs such as iodine/iodide ions, bromine/bromide ions, and the like may be added and obtained as the oxidation-reduction pair. For the supply source of the iodide ions or bromide ions, a lithium salt, quaternary imidazolium salt, tetrabutylammonium salt, and the like may be used alone or in combination.

Various additives or solvents, such as tert-butylpyridine, may be added to the electrolyte composition according to the second embodiment of the present invention if required, in an amount in which the properties or characteristics of the electrolyte composition are not affected.

Insulating particles may be contained in the electrolyte composition according to the second embodiment of the present invention in an amount in which characteristics of the electrolyte composition are not affected. Here, an example of insulating particles includes particles of diamond or boron nitride (BN).

The methods for preparing the electrolyte composition of the present invention from the components described above are not particularly limited, and a method may be employed, for example, in which an electrolyte solution is obtained by adding additives (components soluble in the ionic liquid), such as an oxidation-reduction pair, to an ionic liquid (A) and then blending the above-described oxide semiconductor particles (B), or oxide semiconductor particles (B) and conductive particles (C) (i.e., particles insoluble in the ionic liquid) into the electrolyte solution to form a gel. For blending the electrolyte solution and the particles (B), (C), any of appropriate well-known agitators, mixers, or centrifugal separators may be used.

The electrolyte composition according to the second embodiment of the present invention is preferably used as an electrolyte used in photoelectric conversion elements, such as dye-sensitized photovoltaic cells, for example.

In the case of a gelling agent that is typically used in a conventional gel electrolyte, such as polymers, the electrical resistance is high. Thus, there is a problem in that the conductivity of the electrolyte is reduced when it is made into a gel, and photoelectric conversion characteristics of a photoelectric conversion element are deteriorated. In contrast, in the electrolyte composition of the present invention, as shown by the examples described below, better photoelectric conversion characteristics are obtained compared to those using a liquid electrolyte containing an ionic liquid and components soluble in this ionic liquid. The reasons are not clarified, but the present inventors have the following reasoning.

(I) Since the oxide semiconductor particles (B), or the oxide semiconductor particles (B) and the conductive particles (C) can contribute to charge transfer and the electrolyte solution is made into a gel by the oxide semiconductor particles (B), or the oxide semiconductor particles (B) and the conductive particles (C), a gel electrolyte composition obtained through gelling exhibits good conductivity and photoelectric conversion characteristics comparable to those when using a liquid electrolyte.

(II) Cations (imidazolium ions, for example) are absorbed to surfaces of the nanoparticles in the gel electrolyte and counter anions ($I^-$ or $I_3^-$) are arranged so that they encircle the cations. As a result, the concentration of redox pairs is increased locally on the surfaces of the nanoparticles. Especially in a dye-sensitized photovoltaic cell using an ionic liquid, cases have been reported where charges transfer by means of a conjugation of physical diffusion and electron exchange reaction in an electrolyte, and the latter, i.e., a more rapid charge transfer process, is accelerated in a composition where the redox concentration is high. In other words, it is believed that electric power generation characteristics are improved without increasing an absolute redox concentration (increasing the absolute amount of $I_3^-$ may reduce the optically transparent property of the electrolyte, thereby inhibiting photoelectric conversion) because the electron exchange reaction process is accelerated by way of regions where the above redox concentration is locally increased.

In addition, since the electrolyte is made into a gel, the electrolyte solution of the second embodiment of the present invention is prevented from being exposed and leaking (fluid leakage) during the manufacturing processes or upon breakage of the cell, providing good productivity and easy handling.

Next, a photoelectric conversion element using the electrolyte composition according to the second embodiment of the present invention will be explained. FIG. 1 is a cross-sectional view showing an example of a schematic structure of a dye-sensitized photovoltaic cell, as an embodiment of the photoelectric conversion element of the present invention.

A dye-sensitized photovoltaic cell 1 includes a transparent electrode substrate 2, a working electrode 6 having an oxide semiconductive porous film 5 made of oxide semiconductive fine particles formed on the transparent electrode substrate 2 and sensitized with a photo-sensitizing dye, and a counter electrode 8 provided opposing the working electrode 6. The above-described electrolyte composition is filled between the working electrode 6 and the counter electrode 8 to form an electrolyte layer 7.

The transparent electrode substrate 2 is made by forming the conductive layer 3 made of a conductive material on a transparent base material 4, such as a glass plate or a plastic sheet.

The transparent base material 4 is preferably made of a material having excellent optical transparent properties when taking its function into consideration. Other than a glass, transparent plastic sheets made of polyethylene terephthalate (PET), polyethylene naphthalate (PEN), polycarbonate (PC), polyether sulfone (PES), or the like; a polished plate of a ceramic, such as titanium oxide, alumina, or the like, may be used.

For the conductive layer 3, it is preferable that transparent oxide semiconductors, such as tin-doped indium oxide (ITO), tin oxide ($SnO_2$), fluorine-doped tin oxide (FTO), or the like, be used either alone or in a mixture of two or more thereof when taking the light transmittance of the transparent electrode substrate 2 into consideration. However, these materials are not limiting, and any suitable material having these materials are not limited, and any suitable material having light transmittance and conductivity appropriate for an intended purpose may be used. Furthermore, in order to improve the current collecting efficiency from the oxide semiconductor porous film 5 or the electrolyte layer 7, a metal wiring layer made of gold, silver, platinum, aluminum, nickel, titanium, or the like, may be used provided that an area ratio of the metal wiring layer is within the range that does not significantly reduce the light transmittance of the transparent electrode substrate 2. When such a metal wiring layer is used, the metal wiring layer may be provided as a grid-like, stripe-like, or comb-like pattern so that light transmits through the transparent electrode substrate 2 as evenly as possible.

The method used to form the conductive layer 3 is not particularly limited, and examples thereof include thin film formation methods, such as a sputtering method, or a CVD method, or a spray decomposition method (SPD), or an evaporation method, when the conductive layer 3 is formed from ITO. The conductive layer 3 is formed to a thickness of between about 0.05 μm and 2.0 μm considering the optical transparent properties and the conductivity.

The oxide semiconductor porous film 5 is a porous thin layer with a thickness between about 0.5 and 50 μm containing as a main component oxide semiconductor fine particles that are made of titanium dioxide ($TiO_2$), tin oxide ($SnO_2$), tungsten oxide ($WO_3$), zinc oxide (ZnO), and niobium oxide ($Nb_2O_5$), used either alone or in a combination of two or more materials, and have an average particle diameter between 1 nm to 1000 nm.

The oxide semiconductor porous film 5 can be formed, for example, by employing methods such as a method in which a dispersion solution obtained by dispersing commercially available oxide semiconductor fine particles in a desired dispersion medium is coated, or a colloidal solution that can be prepared using a sol-gel method is coated, after desired additives have been added thereto if these are required, using a known coating method such as a screen printing method, an inkjet printing method, a roll coating method, a doctor blade method, a spin coating method, a spray coating method, or the like. Other methods include: a electrophoretic deposition method in which the electrode substrate 2 is immersed in a colloidal solution and oxide semiconductor fine particles are made to adhere to the electrode substrate 2 by electrophoresis; a method in which a foaming agent is mixed in a colloidal solution or dispersion solution which is then coated and baked so as to form a porous material; and a method in which polymer microbeads are mixed together and coated on, and these polymer microbeads are then removed by thermal treatment or chemical treatment, so as to define spaces and thereby form a porous material.

The sensitizing dye that is provided in the oxide semiconductor porous film 5 is not particularly limited, and it is possible to use ruthenium complexes or iron complexes containing a ligand having bipyridine structures, terpyridine structures, and the like; metal complexes such as porphyrin and phthalocyanine; as well as organic dyes such as eosin, rhodamine, melocyanine, and coumarin. The dye can be selected according to the application and the material used for the oxide semiconductor porous film.

The counter electrode 8 may be one obtained by forming a thin film made of a conductive oxide semiconductor, such as ITO, FTO, or the like, on a substrate made of a non-conductive material, such as a glass, or one obtained by forming an electrode by evaporating or applying a conductive material, such as gold, platinum, a carbon-based material, and the like, on a substrate. Furthermore, the counter electrode 8 may be one obtained by forming a layer of platinum, carbon, or the like, on a thin film of a conductive oxide semiconductor, such as ITO, FTO, or the like.

A method for forming the counter electrode 8 includes, forming a platinum layer by applying chloroplatinate and then performing a heat treatment, for example. Alternatively, a method may be used in which the electrode is formed on a substrate by an evaporation technique or sputtering technique.

The method for forming the electrolyte layer 7 made of the above-described electrolyte composition on the working electrode 6 is not particularly limited, and a method may be employed in which the electrolyte composition is dropped on the working electrode 6 in a small amount. Alternatively, the electrolyte layer may be formed by coating the electrolyte on the working electrode 6 or the counter electrode 8. By this, it is possible to make the electrolyte composition infiltrate into the spaces in the oxide semiconductor porous film 5 when the electrolyte composition is cast onto the working electrode 6.

Since the electrolyte composition is in a state of a gel in the photoelectric conversion element of the second embodiment of the present invention that can be obtained with the above-described procedures, it has reduced volatility and flowability. Thus, degradation or loss of the electrolyte due to vaporization of the solvent or the like does not occur, and it becomes possible to stably achieve high output characteristics and photoelectric conversion characteristics. Furthermore, leakage of the electrolyte from the gap of a container or scattering thereof upon breakage of a photoelectric conversion element are prevented, providing better safety, durability, and the like compared to the cases where a liquid electrolyte solution is used.

Furthermore, a dye-sensitized photovoltaic cell according to the second embodiment of the present invention includes the above-described photoelectric conversion element. Thus, degradation or loss of the electrolyte due to vaporization of the solvent or the like does not occur, and it becomes possible to stably achieve high output characteristics and photoelectric conversion characteristics. Furthermore, leakage of the electrolyte from the gap of a container or scattering thereof upon breakage of a photoelectric conversion element are prevented, providing better safety, durability, and the like compared to the cases where a liquid electrolyte solution is used.

Hereinafter, examples of the second embodiment of the present invention will be explained.

<Preparation of Electrolyte Composition (1)>

As an ionic liquid (A), 1-ethyl-3-methylimidazolium bis(trifluoromethylsulfonyl)imide (this may be abbreviated as "EMIm-TFSI") was used, and an electrolyte solution containing iodine/iodide ions as an oxidation-reduction pair was prepared by dissolving appropriate amounts of 1-ethyl-3-methylimidazolium iodide (EMIm-I), iodine, lithium iodide, and an appropriate amount of 4-tert-butylpyridine into this ionic liquid.

Electrolyte compositions of Examples B-1 to B-10 were obtained as follows. Nanoparticles of titanium dioxide (in Table 2, shown labeled as "$TiO_2$") having an average particle diameter of between 2 nm and 1000 nm as oxide semiconductor particles (B) were blended into the above electrolyte solution (one including EMIm-TFSI as an ionic liquid) so that the total amount with respect to the electrolyte solution was 10% by weight (Example B-1). Alternatively, nanoparticles of titanium dioxide and carbon nanotubes (in Table 2, shown labeled as "CNT") as conductive particles (C) were blended such that the total compounding amount of the particles was 1% by weight with respect to the total amount of the electrolyte solution in the compounding ratio shown in Table 2 (the values are represented when the total compounding amount of the particles is regarded as 100%) (Examples B-2 to B-10). The mixtures were then centrifuged to obtain electrolyte compositions of Examples B-1 to B-10 in which the ionic liquid formed a gel.

As the carbon nanotubes, single-wall carbon nanotubes (In Table 2, abbreviated as "SWCNT") and multi-wall carbon nanotubes (In Table 2, abbreviated as "MWCNT") were used in the compounding amounts shown in Table 2. In Table 2, values under each of the labels of "$TiO_2$," "SWCNT," and "MWCNT" represent compounding ratios in % by weight of each particle in the total compounding amount before centrifuging the particles (1% by weight with respect to the total amount of the electrolyte solution).

The column labeled "Ratio of Particles after Centrifugation" in Table 2 lists the ratio of particles insoluble in the ionic liquid after centrifugation of the particles (in this example, the sum of $TiO_2$ nanoparticles and CNTs) when the total electrolyte composition is regarded as 100%.

Electrolyte compositions of Examples B-11 to B-14 were obtained as follows. Titanium oxide nanotubes as oxide semiconductor particles (B) were blended into the above electrolyte solution (one including EMIm-TFSI as an ionic liquid) so that the total amount with respect to the electrolyte solution was 10% by weight (Example B-11). Alternatively, titanium oxide nanotubes and titanium oxide nanoparticles were blended such that the total compounding amount of the particles was 10% by weight with respect to the total amount of the electrolyte solution in the compounding ratio shown in Table 3 (the values are represented when the total compounding amount of the particles is regarded as 100%) (Examples B-12 to B-14). The mixtures were then centrifuged to obtain electrolyte compositions of Examples B-11 to B-14 in which the ionic liquid formed a gel.

The column labeled "Ratio of Particles after Centrifugation" in Table 3 lists the ratio of particles insoluble in the ionic liquid after centrifugation of the particles (in this example, the sum of nanotubes and nanoparticles made of $TiO_2$) when the total electrolyte composition is regarded as 100%.

Electrolyte compositions of Examples B-15 to B-17 were obtained as follows. Titanium oxide nanotubes (CNTs) as oxide semiconductor particles (B) and carbon nanotubes as conductive particles (C) were blended into the above electrolyte solution (one including EMIm-TFSI as an ionic liquid) such that the total compounding amount of the particles was 1% by weight with respect to the total amount of the electrolyte solution in the compounding ratio shown in Table 4 (the values are represented when the total compounding amount of the particles is regarded as 100%) (Examples B-15 to B-17). The mixtures were then centrifuged to obtain electrolyte compositions of Examples B-15 to B-17 in which the ionic liquid formed a gel. In Examples B-15 to B-17, MWCNTs were used as carbon nanotubes.

The column labeled "Ratio of Particles after Centrifugation" in Table 4 lists the ratio of particles insoluble in the ionic liquid after centrifugation of the particles (in this example, the sum of the titanium oxide nanoparticles and carbon nanotubes) when the total electrolyte composition is regarded as 100%.

Electrolyte compositions of Examples B-18 to B-25 were obtained as follows. Various nanoparticles made from materials listed in the column of "Oxide Semiconductor Particles" of Table 5 as oxide semiconductor particles (B) were blended into the above electrolyte solution (one including EMIm-TFSI as an ionic liquid) such that the amount of the particles was 10% by weight with respect to the total amount of the electrolyte solution (the values are represented when the total compounding amount of the particles is regarded as 100%). The mixtures were then centrifuged to obtain electrolyte compositions of Examples B-18 to B-25 in which the ionic liquid formed a gel.

The column labeled "Ratio of Particles after Centrifugation" in Table 5 lists the ratio of particles insoluble in the ionic liquid after centrifugation of the particles (in this example, the sum of the oxide semiconductor particles) when the total electrolyte composition is regarded as 100%.

<Preparation of Electrolyte Composition (2)>

As an ionic liquid (A), 1-hexyl-3-methylimidazolium iodide (this may be abbreviated as "HMIm-I") or 1-ethyl-3-methylimidazolium dicyanoimide (this may be abbreviated as "EMIm-DCA") was used, and an electrolyte solution containing iodine/iodide ions as an oxidation-reduction pair was prepared by dissolving appropriate amounts of EMIm-I, iodine, and lithium iodide, and an appropriate amount of 4-tert-butylpyridine into this ionic liquid.

Electrolyte compositions of Examples B-26 and B-27 were obtained as follows. Nanoparticles of titanium dioxide (in Table 2, shown labeled as "TiO$_2$") having an average particle diameter of between 2 nm and 1000 nm as oxide semiconductor particles (B) were blended so that the amount with respect to the total amount of the electrolyte solution was 10% by weight. The mixtures were then centrifuged to obtain electrolyte compositions of Examples B-26 and B-27 in which the ionic liquid formed a gel.

The column labeled "Ratio of Particles after Centrifugation" in Table 6 lists the ratio of particles insoluble in the ionic liquid after centrifugation of the particles (in this example, TiO$_2$ nanoparticles) when the total electrolyte composition is regarded as 100%.

<Fabrication of Photoelectric Conversion Elements of Examples B-1 to B-27>

As a transparent electrode substrate, a 100 mm×100 mm glass substrate having an FTO film formed thereon was provided, and a slurry dispersion solution of titanium oxide having an average particle diameter of 20 nm was applied on the FTO film (conductive layer) side surface of this transparent electrode substrate 2. After being dried, an oxide semiconductor porous film having a thickness of 7 μm was obtained by performing heating treatment at 450° C. for one hour. The transparent electrode substrate was then immersed overnight in an ethanol solution of ruthenium bipyridine complex (an N3 dye) so as to be sensitized with the dye to form a working electrode. Furthermore, as a counter electrode, an FTO glass electrode substrate was prepared having an electrode layer made of platinum formed thereon by sputtering.

In order to form the electrolyte layer on the working electrode, the electrolyte composition that was made into a gel was dropped to the oxide semiconductor porous film of the working electrode in a small amount, and then the counter electrode and the electrolyte layer were adhered together by overlaying them while pressing the counter electrode hard. In the procedures described above, dye-sensitized photovoltaic cells which were test cells of Examples B-1 to B-27 were fabricated.

<Fabrication of Test Cell of Comparative Example B-1>

As the working electrode and the counter electrode, electrodes similar to those used in the above-described test cells of Examples B-1 to B-27 were used. As an electrolyte solution to form an electrolyte, an ionic liquid [1-ethyl-3-methylimidazolium bis(trifluoromethylsulfonyl)imide (EMIm-TFSI)] containing iodine/iodide ions as an oxidation-reduction pair was prepared and used. This electrolyte solution was similar to those used to prepare the electrolyte solutions for the electrolyte compositions of the test cells of Examples B-1 to B-27, except that oxide semiconductor particles (B), or oxide semiconductor particles (B) and conductive particles (C) were not added.

A dye-sensitized photovoltaic cell which was the test cell of Comparative Example B-1 was fabricated by placing the working electrode and the counter electrode so that they opposed each other and forming an electrolyte layer by injecting the electrolyte solution therebetween.

<Fabrication of Test Cell of Comparative Example B-2>

As the working electrode and the counter electrode, electrodes similar to those used in the above-described test cells of Examples B-1 to B-27 were used. As an electrolyte solution to form an electrolyte, an acetonitrile solution containing quaternary imidazolium-iodide, lithium iodide, iodine, and 4-tert-butylpyridine was prepared and used.

A dye-sensitized photovoltaic cell which was the test cell of Comparative Example B-2 was fabricated by placing the working electrode and the counter electrode so that they opposed each other and forming an electrolyte layer by injecting the electrolyte solution therebetween.

<Fabrication of Test Cell of Comparative Examples B-3 and B-4>

As the working electrode and the counter electrode, electrodes similar to those used in the above-described test cells of Examples B-1 to B-27 were used. As an electrolyte solution to form an electrolyte, an ionic liquid containing iodine/iodide ions as an oxidation-reduction pair was prepared and used. As shown in Table 6, as the ionic liquid, HMIm-I was used in Comparative Example B-3 and EMIm-DCA was used in Comparative Example B-4. These electrolyte solutions were similar to those used to prepare the electrolyte solutions for the electrolyte compositions of the test cells of Examples B-1 to B-27 shown in Table 6, except that oxide semiconductor particles (B), or oxide semiconductor particles (B) and conductive particles (C) were not added.

Dye-sensitized photovoltaic cells which were the test cell of Comparative Examples B-3 and B-4 were fabricated by placing the working electrode and the counter electrode so that they opposed each other and forming an electrolyte layer by injecting the electrolyte solution therebetween.

<Photoelectric Conversion Characteristic of Test Cells>

Photoelectric conversion characteristics of each of the above-described test cells were measured. The conversion efficiency of each of the test cells is listed in Tables 2 to 7. It should be noted that the results of Example B-11 are listed in both Table 3 and Table 4. Furthermore, the results of Comparative Example B-1 are listed in all of Table 2, Table 3, Table 4, and Table 5.

TABLE 2

| | | CNT | | Ratio of Particles after Centrifugation | State | Conversion Efficiency (%) |
|---|---|---|---|---|---|---|
| | TiO$_2$ | SWCNT | MWCNT | | | |
| Example B-1 | 100 | — | — | 15.3% | gel | 5.0 |
| Example B-2 | 80 | 20 | — | 11.2% | gel | 4.7 |
| Example B-3 | 50 | 50 | — | 5.2% | gel | 4.5 |
| Example B-4 | 20 | 80 | — | 4.3% | gel | 4.3 |
| Example B-5 | 80 | — | 20 | 5.2% | gel | 4.7 |
| Example B-6 | 50 | — | 50 | 3.2% | gel | 4.8 |
| Example B-7 | 20 | — | 80 | 2.3% | gel | 4.3 |

TABLE 2-continued

| | CNT | | | Ratio of Particles after Centrifugation | State | Conversion Efficiency (%) |
|---|---|---|---|---|---|---|
| | TiO₂ | SWCNT | MWCNT | | | |
| Example B-8 | 80 | 10 | 10 | 7.6% | gel | 4.9 |
| Example B-9 | 60 | 20 | 20 | 4.1% | gel | 4.9 |
| Example B-10 | 20 | 40 | 40 | 1.5% | gel | 4.7 |
| Comparative Example B-1 | ionic liquid only | | | | liquid | 4.1 |
| Comparative Example B-2 | acetonitrile solution of redox pair | | | | liquid | 5.5 |

TABLE 3

| | Titanium Oxide Nanotubes | Titanium Oxide Nano-particles | Ratio of Particles after Centrifugation | State | Conversion Efficiency (%) |
|---|---|---|---|---|---|
| Example B-11 | 100% | 0% | 10.2% | gel | 5.1 |
| Example B-12 | 80% | 20% | 11.2% | gel | 5.2 |
| Example B-13 | 50% | 50% | 15.2% | gel | 5.0 |
| Example B-14 | 20% | 80% | 15.8% | gel | 5.5 |
| Comparative Example B-1 | ionic liquid only | | | liquid | 4.1 |

TABLE 4

| | Titanium Oxide Nanotubes | Carbon Nano-tubes | Ratio of Particles after Centrifugation | State | Photoelectric Conversion Efficiency (%) |
|---|---|---|---|---|---|
| Example B-11 | 100% | 0% | 10.2% | gel | 5.1 |
| Example B-15 | 80% | 20% | 5.2% | gel | 5.5 |
| Example B-16 | 50% | 50% | 4.2% | gel | 5.3 |
| Example B-17 | 20% | 80% | 2.3% | gel | 5.5 |
| Comparative Example B-1 | ionic liquid only | | | liquid | 4.1 |

TABLE 5

| | Oxide Semiconductor Particles | Ratio of Particles after Centrifugation | State | Photoelectric Conversion Efficiency (%) |
|---|---|---|---|---|
| Example B-18 | TiO₂ (anatase) | 15.2% | gel | 5.1 |
| Example B-19 | TiO₂ (rutile) | 14.6% | gel | 5.2 |
| Example B-20 | TiO₂ (brookite) | 29.3% | gel | 5.0 |
| Example B-21 | ZnO | 36.5% | gel | 4.9 |
| Example B-22 | SnO₂ | 30.2% | gel | 4.8 |
| Example B-23 | ITO | 36.1% | gel | 4.9 |
| Example B-24 | BaTiO₃ | 60.2% | gel | 4.9 |
| Example B-25 | Al₂O₃ | 21.8% | gel | 4.6 |
| Comparative Example B-1 | ionic liquid only | | liquid | 4.1 |

TABLE 6

| | Ionic Liquid | Oxide Semiconductor Particles | Ratio of Particles after Centrifugation | State | Photoelectric Conversion Efficiency (%) |
|---|---|---|---|---|---|
| Example B-26 | HMIm-I | TiO₂ | 21.3 | gel | 6.0 |
| Example B-27 | EMIm-DCA | TiO₂ | 19.2 | gel | 6.1 |
| Comparative Example B-3 | HMIm-I | none | | liquid | 4.5 |
| Comparative Example B-4 | EMIm-DCA | none | | liquid | 5.9 |

As shown by the above results, high conversion efficiencies that were comparable to conversion efficiencies achievable when a liquid electrolyte (an electrolyte solution) is used were obtained even when the electrolyte was in a state of a gel in the test cells of Examples B-1 to B-27 according to the second embodiment of the present invention. Japanese Unexamined Patent Application, First Publication No. 2002-184478 discloses a conversion efficiency of a photoelectric conversion element at an early stage of 2.0% when an electrolyte was made into a gel. As in this case, conventionally, conversion efficiencies when a gel electrolyte is used have been significantly lower than those when an electrolyte solution is used, which did not occur in the present invention. Accordingly, advantageous effects of making an electrolyte solution (an ionic liquid or the like) into a gel using oxide semiconductor particles (B), or oxide semiconductor particles (B) and conductive particles (C) are apparent.

Furthermore, to clarify the advantageous effects of the oxide semiconductor particles (B), or the oxide semiconductor particles (B) and the conductive particle (C), the cases where the ionic liquid solutions were a gel (pseudo-solid) by means of addition of these particles and the cases where the ionic liquid solutions were a liquid without addition of the particles were compared. In each of the cases where the ionic liquid was EMIm-TFSI (Example B-1 to B-25 and Comparative Example B-1), where the ionic liquid was HMIm-I (Example B-26 and Comparative Example B-3), and where the ionic liquid was EMIm-DCA (Example B-27 and Comparative Example B-4), a surprising result that a higher conversion efficiency was obtained when the oxide semiconductor particles (B), or the oxide semiconductor particles (B) and the conductive particle (C) were added. In other words, a better electrolyte composition could be prepared when the oxide semiconductor particles (B), or the oxide semiconductor particles (B) and the conductive particle (C) were added to the ionic liquid solution (electrolyte solution), compared to cases when they were not added.

<Comparison between Liquid Electrolyte and Gel Electrolyte>

Next, characteristics of a liquid electrolyte and a gel electrolyte containing components insoluble in the gel electrolyte were compared (see Table 7 and Table 8) to examine the characteristics of the insoluble components.

A liquid electrolyte (electrolyte solution) prepared by adding iodine, lithium iodide, a dialkyl imidazolium iodide, and 4-tert-butylpyridine into an ionic liquid as a main component was used.

In this case, 1-ethyl-3-methylimidazolium bis(trifluoromethylsulfonyl)imide (EMIm-TFSI), or 1-hexyl-3-methylimidazolium iodide (HMIm-I), or 1-ethyl-3-methylimidazolium dicyanoimide (EMIm-DCA) was used as the ionic liquid (see Table 7 and Table 8).

As gel electrolytes of Examples B-28 to B-35, using the same procedure described in the above "Preparation of Electrolyte Composition" section, electrolyte compositions of the present invention obtained by blending the above-described liquid electrolyte and oxide semiconductor particles (B) listed in Table 7 were used. In Table 7, $TiO_2[1]$ represents anatase (($\phi$=28 nm), $TiO_2[2]$ represents anatase (($\phi$=80 nm), and $TiO_2[3]$ represents rutile (($\phi$=70 nm).

Gel electrolytes of Comparative Examples B-5 and B-6 were obtained by making the liquid electrolyte into a gel (quasi-solid) using the gelling agents listed in Table 8. In Table 8, "PVdF-HFP" represents a fluororesin-based gelling agent (polyvinylidene fluoride-hexafluoropropylene copolymer). Furthermore, as a low molecular weight gelling agent, a commercially available low molecular weight gelling agent was used.

In other words, in this comparative test, the gel electrolyte is one having a composition where oxide semiconductor particles (B) or gelling agents were added to a liquid electrolyte. Furthermore, a "liquid electrolyte corresponding to a gel electrolyte" refers to a liquid electrolyte having a composition in which the oxide semiconductor particles (B) or gelling agents are omitted from that gel electrolyte.

TABLE 7

| | Oxide Semiconductor Particle | Ionic Liquid | Rate of Change of DI (%) | Shift Width of EP (mV) | Photoelectric Conversion Efficiency (%) | |
|---|---|---|---|---|---|---|
| | | | | | Liquid system | Gel system |
| Example B-28 | $TiO_2$ [1] | EMIm-TFSI | 62 | 36 | 4.1 | 5.3 |
| Example B-29 | $TiO_2$ [1] | HMIm-I | 125 | 53 | 4.5 | 6.0 |
| Example B-30 | $TiO_2$ [1] | EMIm-DCA | 110 | 55 | 5.7 | 6.2 |
| Example B-31 | $TiO_2$ [2] | EMIm-TFSI | 60 | 20 | 4.1 | 5.5 |
| Example B-32 | $TiO_2$ [3] | EMIm-TFSI | 25 | 18 | 4.1 | 5.2 |
| Example B-33 | $SnO_2$ | EMIm-TFSI | 48 | 18 | 4.1 | 4.8 |
| Example B-34 | ITO | EMIm-TFSI | 53 | 24 | 4.1 | 4.9 |
| Example B-35 | $BaTiO_3$ | EMIm-TFSI | 44 | 20 | 4.1 | 4.9 |

$TiO_2$ [1]: anatase ($\phi$ = 28 nm)
$TiO_2$ [2]: anatase ($\phi$ = 80 nm)
$TiO_2$ [3]: rutile ($\phi$ = 70 nm)

TABLE 8

| | Gelling Agent | Ionic Liquid | Rate of Change of DI (%) | Shift Width of EP (mV) | Photoelectric Conversion Efficiency (%) | |
|---|---|---|---|---|---|---|
| | | | | | Liquid system | Gel system |
| Comparative Example B-5 | PVdF-HFP | EMIm-TFSI | Very small change | Very small change | 4.1 | 3.8 |
| Example B-6 | Low molecular weight gelling agent | EMIm-TFSI | −20 | Very small change | 4.1 | 3.9 |

<Measurement of Cyclic Voltammetry of Liquid Electrolyte and Gel Electrolyte>

Cyclic voltammetries were performed for the gel electrolytes and the liquid electrolytes listed in Table 7 and Table 8 using platinum microelectrodes (having a diameter of 10 μm) under conditions of 25° C. and an argon atmosphere (with a sweep rate of 2 mV/s). Diffusion coefficients (apparent diffusion coefficients) of $I^-/I_3^-$ were calculated from the obtained limiting current values using the following Formula (1).

$$I_{lim} = 4nFCD_{app}r \quad \text{Formula (1)}$$

where $I_{lim}$ is a limiting current, n is the number of reacted electrons, F is the Faraday constant, C is the carrier concentration, $D_{app}$ is the diffusion coefficient, and r is a radius of the electrodes.

Furthermore, equilibrium potentials ($E_{eq}$) were obtained as electrode potentials corresponding to zero current in the cyclic voltammogram.

Measurements of diffusion coefficients ($D_{app}$) and equilibrium potentials ($E_{eq}$) using cyclic voltammetry using microelectrodes are described in a report by Ryuji Kawano and Masayoshi Watanabe [M. Chem. Commun., United Kingdom, 2003, p.p. 330-331], for example.

A diffusion coefficient measured using a liquid electrolyte is termed as a diffusion coefficient in a liquid system, a diffusion coefficient measured using a gel electrolyte is termed as a diffusion coefficient in a gel system, and a rate of change in the diffusion coefficients is termed as (the diffusion coefficient in the gel system—the diffusion coefficient in the liquid system/the diffusion coefficient in the liquid system). An equilibrium potential measured using a liquid electrolyte is termed as an equilibrium potential in a liquid system, an equilibrium potential measured using a gel electrolyte is termed as a equilibrium potential in a gel system, and a shift width of the equilibrium potentials is termed as (the equilibrium potential in the gel system—the equilibrium potential in the liquid system).

The rate of change in the diffusion coefficients and the shift width of the equilibrium potentials were calculated for each of the gel electrolytes of the above Examples B-28 to B-35 and Comparative Examples B-5 and B-6 and the corresponding liquid electrolytes, and the results are summarized in the above Table 7 and Table 8. It should be noted that the label "Very small change" is used in Table 8 for cases where the rate of change in the diffusion coefficients is less than 5% or the shift width of the equilibrium potentials is less than 10 mV.

<Fabrication of Test Cell using Liquid Electrolyte and Gel Electrolyte and Evaluation Thereof>

Following a similar procedure as that in the above "Fabrication of Test Cell," dye-sensitized photovoltaic cells were fabricated using the gel electrolytes and liquid electrolytes listed in Table 7 and Table 8. The measurement conditions for the photoelectric conversion characteristics were photoirradiation conditions with an air mass (AM) of 1.5 and an irradiance of 100 mW/cm².

Results of raw measurement photoelectric conversion efficiency (conversion efficiency) of gel electrolytes and corresponding liquid electrolytes of the above Examples B-28 to B-35 and Comparative Examples B-5 and B-6 are listed in the above Table 7 and Table 8. In the above Table 7 and Table 8, photoelectric conversion efficiencies measured using liquid electrolytes are shown under the column labeled "Conversion Efficiency/Liquid system," and diffusion coefficients measured using gel electrolytes are shown under the column labeled "Conversion Efficiency/Gel system."

As shown by the results in Table 7 and Table 8, in the gel electrolytes of Examples B-28 to B-35, the rates of change in the diffusion coefficients of the corresponding liquid electrolytes were relatively large positive values. From this fact, it is considered that charge transfer was faster in the gel electrolytes of Examples B-28 to B-35 compared to the corresponding liquid electrolytes, and consequently, the conversion efficiencies were enhanced. Furthermore, it is considered that a photoelectric conversion cell having a greater electromotive force can be fabricated since the shift widths of the equilibrium potential were also relatively large positive values and are shifted to the positive potential side.

In contrast, in the gel electrolytes of Comparative Examples B-5 and B-6, the rates of change in the diffusion coefficients and the shift widths of the equilibrium potential exhibited very small changes or even negative values, and changes in characteristics due to gel formation were not observed or even became worse.

Furthermore, when conversion efficiencies are compared, in the gel electrolytes of Examples B-28 to B-35, the conversion efficiencies of the gel systems were greater in values than the conversion efficiencies of the liquid systems. In contrast, in the gel electrolytes of Comparative Examples B-5 and B-6, the conversion efficiencies of the gel systems were smaller in values than the conversion efficiencies of the liquid systems.

From the above, according to the electrolyte composition of the second embodiment of the present invention, it is considered that an electrolyte having better characteristics than an ionic liquid (A) itself can be obtained by adding oxide semiconductor particles (B), or oxide semiconductor particles (B) and conductive particle (C) into an ionic liquid (A).

From the above descriptions and examples, an invention defined by the following supplementary notes is obtained.

(Supplementary note 1) An electrolyte composition comprising an ionic liquid, one or more components soluble in the ionic liquid, and one or more components insoluble in the ionic liquid, wherein the soluble components include an oxidation-reduction pair and the insoluble components include oxide semiconductor particles, or oxide semiconductor particles and conductive particles, and wherein a diffusion coefficient of the oxidation-reduction pair in the electrolyte composition is greater than a diffusion coefficient of the oxidation-reduction pair in a composition comprising an ionic liquid and one or more components soluble in the ionic liquid.

(Supplementary note 2) An electrolyte composition comprising an ionic liquid, one or more components soluble in the ionic liquid, and one or more components insoluble in the ionic liquid, wherein the soluble components include an oxidation-reduction pair and the insoluble components include oxide semiconductor particles, or oxide semiconductor particles and conductive particles, and wherein an equilibrium potential of the oxidation-reduction pair in the electrolyte composition is shifted to a positive potential side exceeding an equilibrium potential of the oxidation-reduction pair in a composition comprising an ionic liquid and one or more components soluble in the ionic liquid.

(Supplementary note 3) The electrolyte composition according to Supplementary note 1 made into a gel.

(Supplementary note 4) The electrolyte composition according to Supplementary note 1 wherein the insoluble components are nanoparticles or nanotubes.

(Supplementary note 5) The electrolyte composition according to Supplementary note 1 wherein the oxidation-reduction pair is a halogen-based redox pair.

It should be noted that insulating particles may be included in the insoluble components in an amount in which characteristics of the electrolyte composition are not affected. Here, an example of insulating particles includes particles of diamond or boron nitride (BN).

The present invention was conceived in light of the above-described circumstances, and an object thereof is to provide an electrolyte composition or a gel electrolyte composition that exhibits the photoelectric conversion efficiency that is comparable to or even better than that of a liquid electrolyte (electrolyte solution) when used as an electrolyte of a photoelectric conversion element, and a photoelectric conversion element or a dye-sensitized photovoltaic cell using the same.
(Third Embodiment)

The present invention will now be described in detail based on a third embodiment of the present invention An electrolyte composition of the present invention contains an ionic liquid (A) and insulating particles (C). Furthermore, in a preferred embodiment, the electrolyte composition of the present invention is made into a gel. As used herein, an electrolyte is regarded as a gel if all of 10 cc of the electrolyte that is placed into a columnar glass tube having an inner diameter of 15 mm and a depth of 10 cm does not fall to the bottom after 15 minutes at room temperature (23° C.) when the glass tube is turned upside down.

The electrolyte composition according to the third embodiment of the present invention contains an ionic liquid (A) as a first essential component.

An example of the ionic liquid (A) is, but not limited to, a room temperature molten salt that is liquid at room temperature and contains a compound containing a quaternized nitrogen atom as a cation. The cation of the room temperature molten salt may be quaternary imidazolium derivatives, quaternary pyridinium derivatives, quaternary pyrrolidinium derivatives, quaternary ammonium derivatives, and the like.

As quaternary imidazolium-based cations, 1,3-dialkyl imidazoliums, such as, 1-ethyl-3-methylimidazolium, 1-ethyl-3-propyl imidazolium, 1-ethyl-3-hexyl imidazolium, 1-hexyl-3-methylimidazolium, are exemplified, for example. As quaternary pyridinium-based cations, N-alkyl pyridiniums, such as N-butyl pyridinium, are exemplified, for example. As quaternary pyrrolidinium-based cations, N,N-dialkyl pyrrolidiniums, such as N-methyl-N-propyl pyrrolidinium and N-methyl-N-butyl pyrrolidinium, are exemplified.

The anion of the room temperature molten salt may be $BF_4^-$, $PF_6^-$, $F(HF)_n^-$, bis(trifluoromethylsulfonyl)imide $[N(CF_3SO_2)_2^-]$, iodide ions, bromide ions, dicyanamide, and the like.

Specific examples of the ionic liquid (A) may include salts made of a quaternary imidazolium cation, and iodide ion or bis(trifluoromethylsulfonyl)imide ion, dicyanamide ion, and the like.

The electrolyte composition according to the third embodiment of the present invention contains insulating particles (C) as a second essential component.

Types of the material of the insulating particles (C) and the particle size thereof are not limited, but those that exhibit a miscibility with the electrolyte solution, which contains an ionic liquid as a main component, and can make the electrolyte solution into a gel are preferred. In addition, the conductive particles should not cause a decrease in the conductivity in the electrolyte composition, and exhibit chemical stability to other co-existing components contained in the electrolyte composition. Especially, it is preferable that the conductive particles be not degraded by an oxidation reaction even when the electrolyte composition contains an oxidation-reduction pair, such as iodine/iodide ion or bromine/bromide ion.

An example of insulating particles (C) includes one member or a mixture of two or more members selected from the group consisting of diamond and boron nitride (BN).

The insulating particles (C) are preferably nanoparticles. Nanoparticles are particles having a particle size in the order of nanometer (i.e., less than 1000 nm). When nanoparticles have a tubular shape, it is suffice that their diameter (miner diameter) be in the order of nanometer and the length (major diameter) be several micrometers or greater.

It is preferable that the compounding amount of the insulating particles (C) be no less than 0.05% by weight and no more than 70% by weight with respect to the total amount of the electrolyte composition. More preferably, it is preferable that it be no less than 0.05% by weight and no more than 50% by weight.

Setting the compounding amount of the insulating particles (B) within the above range can enable the electrolyte solution containing the ionic liquid (A) to form a gel, and the electrolyte solution is prevented from being exposed and leaking (fluid leakage) during the manufacturing processes or upon breakage of the cell.

If the compounding amount of the insulating particles (C) is less than 0.05% by weight with respect to the total amount of the electrolyte composition, the ionic liquid does not form a gel and fluid leakage or the like may occur upon breakage. In contrast, if the compounding amount of the insulating particles (C) exceeds 70% by weight with respect to the total amount of the electrolyte composition, the particles (C) may absorb all of the ionic liquid and the solution may not function as an electrolyte.

Oxidation-reduction pairs (redox pairs) may be added to the electrolyte composition according to the third embodiment of the present invention, although they are not an essential component. It is preferable to add an oxidation-reduction pair when the electrolyte composition is used in a dye-sensitized photovoltaic cell or the like.

As the oxidation-reduction pair, a halogen-based redox pair made of halide ions, such as iodide ions ($I^-$), bromide ions ($Br^-$), or chloride ions ($Cl^-$), or polyhalide ions, such as $I_3^-$, $I_5^-$, $I_7^-$, $Br_3^-$, $Cl_2I^-$, $ClI_2^-$, $Br_2I^-$, $BrI_2^-$, is preferably used, although these are not limiting.

For example, pairs such as iodine/iodide ions, bromine/bromide ions, and the like may be added and obtained as the oxidation-reduction pair. For the supply source of the iodide ions or bromide ions, a lithium salt, quaternary imidazolium salt, tetrabutylammonium salt, and the like may be used alone or in combination.

Various additives or solvents, such as tert-butylpyridine, may be added to the electrolyte composition according to the third embodiment of the present invention if required, as long as properties or characteristics of the electrolyte composition are not affected.

The methods for preparing the electrolyte composition of the present invention from the components described above are not particularly limited, and a method may be employed, for example, in which an electrolyte solution is obtained by adding additives (components soluble in the ionic liquid), such as an oxidation-reduction pair, to an ionic liquid (A) and then blending the above-described insulating particles (C) (i.e., components insoluble in the ionic liquid) into the electrolyte solution to form a gel. For blending the electrolyte solution and the insulating particles (C), any of appropriate well-known agitators, mixers, or centrifugal separators may be used.

The electrolyte composition according to the third embodiment of the present invention is preferably used as an electrolyte used in photoelectric conversion elements, such as dye-sensitized photovoltaic cells, for example.

In the case of a gelling agent that is typically used in a conventional gel electrolyte, such as polymers, the electrical resistance is high. Thus, there is a problem in that the conductivity of the electrolyte is reduced when it is made into a gel, and photoelectric conversion characteristics of a photoelectric conversion element are deteriorated. In contrast, in the electrolyte composition of the present invention, as shown by the examples described below, better photoelectric conversion characteristics are obtained compared to those using a liquid electrolyte containing an ionic liquid and components soluble in this ionic liquid. The reasons are not clarified, but the present inventors have the following reasoning.

Cations (imidazolium ions, for example) are absorbed to surfaces of the nanoparticles in the gel electrolyte and counter anions ($I^-$ or $I_3^-$) are arranged so that they encircle the cations. As a result, the concentration of redox pairs is increased locally on the surfaces of the nanoparticles. Especially in a dye-sensitized photovoltaic cell using an ionic liquid, cases have been reported where charges transfer by means of a conjugation of physical diffusion and electron exchange reaction in an electrolyte, and the latter, i.e., a more rapid charge transfer process, is accelerated in a composition where the redox concentration is high. In other words, it is believed that electric power generation characteristics are improved without increasing an absolute redox concentration (increasing the absolute amount of $I_3^-$ may reduce the optically transparent property of the electrolyte, thereby inhibiting photoelectric conversion) because the electron exchange reaction process is accelerated by way of regions where the above redox concentration is locally increased.

In addition, since the electrolyte is made into a gel, the electrolyte solution of the third embodiment of the present invention is prevented from being exposed and leaking (fluid leakage) during the manufacturing processes or upon breakage of the cell, providing good productivity and easy handling.

Next, a photoelectric conversion element using the electrolyte composition according to the third embodiment of the present invention will be explained. FIG. 1 is a cross-sectional view showing an example of a schematic structure of a dye-sensitized photovoltaic cell, as an embodiment of the photoelectric conversion element of the present invention.

This dye-sensitized photovoltaic cell 1 includes a transparent electrode substrate 2, a working electrode 6 having an oxide semiconductive porous film 5 made of oxide semiconductive fine particles formed on the transparent electrode substrate 2 and sensitized with a photo-sensitizing dye, and a counter electrode 8 provided opposing the working electrode 6. The above-described electrolyte composition is filled between the working electrode 6 and the counter electrode 8 to form an electrolyte layer 7.

The transparent electrode substrate 2 is made by forming the conductive layer 3 made of a conductive material on a transparent base material 4, such as a glass plate or a plastic sheet.

The transparent base material 4 is preferably made of a material having excellent optical transparent properties when taking its function into consideration. Other than a glass, transparent plastic sheets made of polyethylene terephthalate (PET), polyethylene naphthalate (PEN), polycarbonate (PC), polyether sulfone (PES), or the like; a polished plate of a ceramic, such as titanium oxide, alumina, or the like, may be used.

For the conductive layer 3, it is preferable that transparent oxide semiconductors, such as tin-doped indium oxide (ITO), tin oxide ($SnO_2$), fluorine-doped tin oxide (FTO), or the like, be used either alone or in a mixture of two or more thereof when taking the light transmittance of the transparent electrode substrate 2 into consideration. However, these materials are not limiting, and any suitable material having light transmittance and conductivity appropriate for an intended purpose may be used. Furthermore, in order to improve the current collecting efficiency from the oxide semiconductor porous film 5 or the electrolyte layer 7, a metal wiring layer made of gold, silver, platinum, aluminum, nickel, titanium, or the like, may be used provided that an area ratio of the metal wiring layer is within the range that does not significantly reduce the light transmittance of the transparent electrode substrate 2. When such a metal wiring layer is used, the metal wiring layer may be provided as a grid-like, stripe-like, or comb-like pattern so that light transmits through the transparent electrode substrate 2 as evenly as possible.

The method used to form the conductive layer 3 is not particularly limited, and examples thereof include thin film formation methods, such as a sputtering method, or a CVD method, or a spray decomposition method (SPD), or an evaporation method, when the conductive layer 3 is formed from ITO. The conductive layer 3 is formed to a thickness of between about 0.05 μm and 2.0 μm considering the optical transparent properties and the conductivity.

The oxide semiconductor porous film 5 is a porous thin layer with a thickness between about 0.5 and 50 μm containing as a main component oxide semiconductor fine particles that are made of titanium dioxide ($TiO_2$), tin oxide ($SnO_2$), tungsten oxide ($WO_3$), zinc oxide (ZnO), and niobium oxide ($Nb_2O_5$), used either alone or in a combination of two or more materials, and have an average particle diameter between 1 nm to 1000 nm.

The oxide semiconductor porous film 5 can be formed, for example, by employing methods such as a method in which a dispersion solution obtained by dispersing commercially available oxide semiconductor fine particles in a desired dispersion medium is coated, or a colloidal solution that can be prepared using a sol-gel method is coated, after desired additives have been added thereto if these are required, using a known coating method such as a screen printing method, an inkjet printing method, a roll coating method, a doctor blade method, a spin coating method, a spray coating method, or the like. Other methods include: a electrophoretic deposition method in which the electrode substrate 2 is immersed in a colloidal solution and oxide semiconductor fine particles are made to adhere to the electrode substrate 2 by electrophoresis; a method in which a foaming agent is mixed in a colloidal solution or dispersion solution which is then coated and baked so as to form a porous material; and a method in which polymer microbeads are mixed together and coated on, and these polymer microbeads are then removed by thermal treatment or chemical treatment, so as to define spaces and thereby form a porous material.

The sensitizing dye that is provided in the oxide semiconductor porous film 5 is not particularly limited, and it is possible to use ruthenium complexes or iron complexes containing a ligand having bipyridine structures, terpyridine structures, and the like; metal complexes such as porphyrin and phthalocyanine; as well as organic dyes such as eosin, rhodamine, melocyanine, and coumarin. The dye can be selected according to the application and the material used for the oxide semiconductor porous film.

The counter electrode 8 may be one obtained by forming a thin film made of a conductive oxide semiconductor, such as ITO, FTO, or the like, on a substrate made of a non-conductive material, such as a glass, or one obtained by forming an electrode by evaporating or applying a conductive material, such as gold, platinum, a carbon-based material, and the like, on a substrate. Furthermore, the counter electrode 8 may be one obtained by forming a layer of platinum, carbon, or the like, on a thin film of a conductive oxide semiconductor, such as ITO, FTO, or the like.

A method for forming the counter electrode 8 includes, forming a platinum layer by applying chloroplatinate and then performing a heat treatment, for example. Alternatively, a method may be used in which the electrode is formed on a substrate by an evaporation technique or sputtering technique.

The method for forming the electrolyte layer 7 made of the above-described electrolyte composition on the working electrode 6 is not particularly limited, and a method may be employed in which the electrolyte composition is dropped on the working electrode 6 in a small amount. Alternatively, the electrolyte layer may be formed by coating the electrolyte on the working electrode 6 or the counter electrode 8. By this, it is possible to make the electrolyte composition infiltrate into the spaces in the oxide semiconductor porous film 5 when the electrolyte composition is cast onto the working electrode 6.

Since the electrolyte composition is in a state of a gel in the photoelectric conversion element of the present invention that can be obtained with the above-described procedures, it has reduced volatility and flowability. Thus, degradation or loss of the electrolyte due to vaporization of the solvent or the like does not occur, and it becomes possible to stably achieve high output characteristics and photoelectric conversion characteristics. Furthermore, leakage of the electrolyte from the gap of a container or scattering thereof upon breakage of a photoelectric conversion element are prevented, providing better safety, durability, and the like compared to the cases where a liquid electrolyte solution is used.

Furthermore, a dye-sensitized photovoltaic cell according to the third embodiment of the present invention includes the above-described photoelectric conversion element. Thus, degradation or loss of the electrolyte due to vaporization of the solvent or the like does not occur, and it becomes possible to stably achieve high output characteristics and photoelectric conversion characteristics. Furthermore, leakage of the electrolyte from the gap of a container or scattering thereof upon breakage of a photoelectric conversion element are prevented, providing better safety, durability, and the like compared to the cases where a liquid electrolyte solution is used.

Hereinafter, examples of the third embodiment of the present invention will be explained.

<Preparation of Electrolyte Composition>

As an ionic liquid (A), 1-ethyl-3-methylimidazolium bis (trifluoromethylsulfonyl)imide (this will be abbreviated as "EMIm-TFSI") was used, and an electrolyte solution containing iodine/iodide ions as an oxidation-reduction pair was prepared by dissolving appropriate amounts of 1-ethyl-3-methylimidazolium iodide (EMIm-I), iodine, lithium iodide, and an appropriate amount of 4-tert-butylpyridine into this ionic liquid.

Electrolyte compositions of Examples C-1 and C-2 were obtained as follows. Insulating particles (C) listed in Table 9 were blended as the insulating particles (C) into the electrolyte solution including EMIm-TFSI as an ionic liquid such that the amount of the particles was 10% by weight with respect to the total amount of the electrolyte solution (Examples C-1 and C-2). The mixtures were then centrifuged to obtain electrolyte compositions of Examples C-1 and C-2 in which the ionic liquid formed a gel.

In the column labeled "Ratio of Particles after Centrifugation," the ratio of particles (C) after centrifugation is listed when the total electrolyte composition is regarded as 100%.

<Fabrication of Photoelectric Conversion Elements of Examples C-1 and C-2>

As a transparent electrode substrate, a 100 mm×100 mm glass substrate having an FTO film formed thereon was provided, and a slurry dispersion solution of titanium oxide having an average particle diameter of 20 nm was applied on the FTO film (conductive layer) side surface of this transparent electrode substrate 2. After being dried, an oxide semiconductor porous film having a thickness of 7 μm was obtained by performing heating treatment at 450° C. for one hour. The transparent electrode substrate was then immersed overnight in an ethanol solution of ruthenium bipyridine complex (an N3 dye) so as to be sensitized with the dye to form a working electrode. Furthermore, as a counter electrode, an FTO glass electrode substrate was prepared having an electrode layer made of platinum formed thereon by sputtering.

In order to form the electrolyte layer on the working electrode, the electrolyte composition that was made to gel was applied to the oxide semiconductor porous film of the working electrode, and then the counter electrode and the electrolyte layer were adhered together by overlaying them while pressing the counter electrode hard. In the procedures described above, a dye-sensitized photovoltaic cell which was a test cell of Example C-1 was fabricated.

<Fabrication of Test Cell of Comparative Example C-1>

As the working electrode and the counter electrode, electrodes similar to those used in the above-described test cell of Example C-1 were used. As an electrolyte solution to form an electrolyte, an ionic liquid [1-ethyl-3-methylimidazolium bis(trifluoromethylsulfonyl)imide] containing iodine/iodide ions as an oxidation-reduction pair was prepared and used. This electrolyte solution was similar to those used to prepare the electrolyte solutions for the electrolyte composition of the test cell of Example C-1, except that insulating particles (C) were not added.

A dye-sensitized photovoltaic cell which was the test cell of Comparative Example C-1 was fabricated by placing the working electrode and the counter electrode so that they opposed each other and forming an electrolyte layer by injecting the electrolyte solution therebetween.

<Photoelectric Conversion Characteristic of Test Cells>

Photoelectric conversion characteristics of each of the above-described test cells were measured. The conversion efficiency of each of the test cells is listed in Table 9.

TABLE 9

|  | Insulating particles | Ratio of Particles after Centrifugation | State | Photoelectric Conversion Efficiency (%) |
| --- | --- | --- | --- | --- |
| Example C-1 | BN | 30.1% | gel | 4.6 |
| Example C-2 | diamond | 33.3% | gel | 4.7 |
| Comparative Example C-1 |  | ionic liquid only |  | liquid | 4.1 |

As shown by the above results, high conversion efficiencies that were comparable to conversion efficiencies achievable when a liquid electrolyte (an electrolyte solution) is used were obtained even when the electrolyte was in a state of a gel in the test cells of each example of the present invention. Japanese Unexamined Patent Application, First Publication No. 2002-184478 discloses a conversion efficiency of a photoelectric conversion element at an early stage of 2.0% when an electrolyte was made into a gel. As in this case, conventionally, conversion efficiencies when a gel electrolyte is used have been significantly lower than those when an electrolyte solution is used, which did not occur in the present invention. Accordingly, advantageous effects of making an electrolyte solution (an ionic liquid or the like) into a gel using insulating particles (C) are apparent.

Furthermore, to clarify the advantageous effects of the insulating particles (C), the cases where the ionic liquid solutions were a gel (pseudo-solid) by means of addition of these particles (Example C-1) and the cases where the ionic liquid solutions were liquid without addition of the particles (Comparative Examples C-1 and C-2) were compared. A surprising result that a higher conversion efficiency was obtained when the insulating particles (C) were added. In other words, a better electrolyte composition could be prepared when the insulating particles (C) were added to the ionic liquid solution (electrolyte solution), compared to cases when they were not added.

<Comparison between Liquid Electrolyte and Gel Electrolyte>

Next, characteristics of a liquid electrolyte and a gel electrolyte containing components insoluble in the gel electrolyte were compared (see Table 10 and Table 1) to examine the characteristics of the insoluble components.

A liquid electrolyte (electrolyte solution) prepared by adding iodine, lithium iodide, a dialkyl imidazolium iodide, and 4-tert-butylpyridine into an ionic liquid as a main component was used.

In this case, 1-ethyl-3-methylimidazolium bis(trifluoromethylsulfonyl)imide (EMIm-TFSI) was used as the ionic liquid (see Table 10 and Table 11).

As a gel electrolyte of Example C-3, using the same procedure described in the above "Preparation of Electrolyte Composition" section, electrolyte compositions of the present invention obtained by blending the above-described liquid electrolyte and insulating particles (C) listed in Table 10 were used.

Gel electrolytes of Comparative Examples C-2 and C-3 were obtained by making the liquid electrolyte into a gel (quasi-solid) using the gelling agents listed in Table 11. In Table 11, "PVdF-HFP" represents a fluororesin-based gelling agent (polyvinylidene fluoride-hexafluoropropylene copolymer). Furthermore, as a low molecular weight gelling agent, a commercially available low molecular weight gelling agent was used.

In other words, in this comparative test, the gel electrolyte is one having a composition where in insulating particles (C) or gelling agents were added to a liquid electrolyte. Furthermore, a "liquid electrolyte corresponding to a gel electrolyte" refers to a liquid electrolyte having a composition in which the insulating particles (C) or gelling agents are omitted from that gel electrolyte.

TABLE 10

|  | Insulating particle | Ionic Liquid | Rate of Change of DI (%) | Shift Width of EP (mV) | Photoelectric Conversion Efficiency (%) | |
| --- | --- | --- | --- | --- | --- | --- |
|  |  |  |  |  | Liquid system | Gel system |
| Example C-3 | BN | EMIm-TFSI | 17 | 15 | 4.1 | 4.6 |

TABLE 11

|  | Gelling Agent | Ionic Liquid | Rate of Change of DI (%) | Shift Width of EP (mV) | Photoelectric Conversion Efficiency (%) | |
| --- | --- | --- | --- | --- | --- | --- |
|  |  |  |  |  | Liquid system | Gel system |
| Comparative Example C-2 | PVdF-HFP | EMIm-TFSI | Very small | Very small | 4.1 | 3.8 |

TABLE 11-continued

| | Gelling Agent | Ionic Liquid | Rate of Change of DI (%) | Shift Width of EP (mV) | Photoelectric Conversion Efficiency (%) Liquid system | Photoelectric Conversion Efficiency (%) Gel system |
|---|---|---|---|---|---|---|
| Comparative Example C-3 | Low molecular weight gelling agent | EMIm-TFSI | change Very small change | change Very small change | 4.1 | 3.9 |

<Measurement of Cyclic Voltammetry of Liquid Electrolyte and Gel Electrolyte>

Cyclic voltammetries were performed for the gel electrolytes and the liquid electrolytes listed in Table 10 and Table 11 using platinum microelectrodes (having a diameter of 10 μm) under conditions of 25° C. and an argon atmosphere (with a sweep rate of 2 mV/s). Diffusion coefficients (apparent diffusion coefficients) of $I^-/I_3^-$ were calculated from the obtained limiting current values using the following Formula (1).

$$I_{lim} = 4nFCD_{app}r \quad \text{Formula (1)}$$

where $I_{lim}$ is a limiting current, n is the number of reacted electrons, F is the Faraday constant, C is the carrier concentration, $D_{app}$ is the diffusion coefficient, and r is a radius of the electrodes.

Furthermore, equilibrium potentials ($E_{eq}$) were obtained as electrode potentials corresponding to zero current in the cyclic voltammogram.

Measurements of diffusion coefficients ($D_{app}$) and equilibrium potentials ($E_{eq}$) using cyclic voltammetry using microelectrodes are described in a report by Ryuji Kawano and Masayoshi Watanabe [M. Chem. Commun., United Kingdom, 2003, p.p. 330-331], for example.

A diffusion coefficient measured using a liquid electrolyte is termed as a diffusion coefficient in a liquid system, a diffusion coefficient measured using a gel electrolyte is termed as a diffusion coefficient in a gel system, a rate of change in the diffusion coefficients is termed as (the diffusion coefficient in the gel system—the diffusion coefficient in the liquid system/the diffusion coefficient in the liquid system). An equilibrium potential measured using a liquid electrolyte is termed as an equilibrium potential in a liquid system, an equilibrium potential measured using a gel electrolyte is termed as a equilibrium potential in a gel system, and a shift width of the equilibrium potentials is termed as (the equilibrium potential in the gel system—the equilibrium potential in the liquid system).

The rate of change in the diffusion coefficients and the shift width of the equilibrium potentials were calculated for each of the gel electrolytes of the Example C-3 and Comparative Example C-2 and C-3 and the corresponding liquid electrolytes, and the results are summarized in the above Table 10 and Table 11. It should be noted that the label "Very small change" is used in Table 11 for cases where the rate of change in the diffusion coefficients is less than 5% or the shift width of the equilibrium potentials is less than 10 mV.

<Fabrication of Test Cell using Liquid Electrolyte and Gel Electrolyte and Evaluation thereof>

Following a similar procedure as that in the above "Fabrication of Test Cell," dye-sensitized photovoltaic cells were fabricated using the gel electrolytes and liquid electrolytes listed in Table 10 and Table 11.

The measurement conditions for the photoelectric conversion characteristics were photoirradiation conditions with an air mass (AM) of 1.5 and an irradiance of 100 mW/cm².

Results of raw measurement photoelectric conversion efficiency (conversion efficiency) of gel electrolytes and corresponding liquid electrolytes of the above Example C-3 and Comparative Examples C-2 and C-3 are listed in the above Table 10 and Table 11. In the above Table 10 and Table 11, photoelectric conversion efficiencies measured using liquid electrolytes are shown under the column labeled "Conversion Efficiency/Liquid system," and diffusion coefficients measured using gel electrolytes are shown under the column labeled "Conversion Efficiency/Gel system."

As shown by the results in Table 10 and Table 11, in the gel electrolyte of Example C-3, the rates of change in the diffusion coefficients of the corresponding liquid electrolytes are relatively large positive values. From this fact, it is considered that charge transfer was faster in the gel electrolyte of Example C-3 compared to the corresponding liquid electrolytes, and consequently, the conversion efficiencies were enhanced. Furthermore, it is considered that a photoelectric conversion cell having a greater electromotive force can be fabricated since the shift widths of the equilibrium potential were also relatively large positive values and are shifted to the positive potential side.

In contrast, in the gel electrolytes of Comparative Examples C-2 and C-3, the rates of change in the diffusion coefficients and the shift widths of the equilibrium potential exhibited very small changes or even negative values, and changes in characteristics due to gel formation were not observed or even became worse.

Furthermore, when conversion efficiencies are compared, in the gel electrolyte of Example C-3, the conversion efficiency of the gel system was greater in values than the conversion efficiency of the liquid system. In contrast, in the gel electrolytes of the comparative examples, the conversion efficiencies of the gel systems were smaller in values than the conversion efficiencies of the liquid systems.

From the above, according to the electrolyte composition of the present invention, it is considered that an electrolyte having better characteristics than an ionic liquid (A) itself can be obtained by adding insulating particle (C) into an ionic liquid (A).

From the above descriptions and examples, an invention defined by the following supplementary notes is obtained.

(Supplementary note 6) An electrolyte composition comprising an ionic liquid, one or more components soluble in the ionic liquid, and one or more components insoluble in the ionic liquid, wherein the soluble components include an oxidation-reduction pair and the insoluble components include insulating particles, and wherein a diffusion coefficient of the oxidation-reduction pair in the electrolyte composition is greater than a diffusion coefficient of the oxidation-reduction pair in a composition comprising an ionic liquid and one or more components soluble in the ionic liquid.

(Supplementary note 7) An electrolyte composition comprising an ionic liquid, one or more components soluble in the ionic liquid, and one or more components insoluble in the ionic liquid, wherein the soluble components include an oxidation-reduction pair and the insoluble components include insulating particles, and wherein an equilibrium potential of the oxidation-reduction pair in the electrolyte composition is shifted to a positive potential side exceeding an equilibrium potential of the oxidation-reduction pair in a composition comprising an ionic liquid and one or more components soluble in the ionic liquid.

(Supplementary note 8) The electrolyte composition according to Supplementary note 6 made into a gel.

(Supplementary note 9) The electrolyte composition according to Supplementary note 6 wherein the insoluble components are nanoparticles or nanotubes.

(Supplementary note 10) The electrolyte composition according to Supplementary note 6 wherein the oxidation-reduction pair is a halogen-based redox pair.

Industrial Applicability

The electrode of the present invention is preferably used as an electrolyte used in photoelectric conversion elements, such as dye-sensitized photovoltaic cells, for example. In addition, the electrode is expected to be useful for various elements having electric or electrochemical actions.

The invention claimed is:

1. An electrolyte composition comprising:
an ionic liquid including a room temperature molten salt containing a cation,
oxide semiconductor particles and
a redox pair, the electrolyte composition excluding an organic gelling agent
wherein:
a liquid electrolyte is defined as the electrolyte composition excluding the oxide semiconductor particles,
a rate of change in diffusion coefficients is not less than 25% and not more than 125%, the rate of change in the diffusion coefficients being defined as, and
a compounding amount of the oxide semiconductor particles is not less than 0.05% by weight and not more than 70% by weight with respect to a total amount of the electrolyte composition to make the electrolyte composition into a gel.

2. The electrolyte composition according to claim 1, further comprising conductive particles;
wherein the liquid electrolyte is the same as the electrolyte composition prior to addition of the oxide semiconductor and the conductive particles.

3. The electrolyte composition according to claim 1, wherein the oxide semiconductor particles are one member or a mixture of two or more members selected from the group consisting of $TiO_2$, $SnO_2$, $WO_3$, ZnO, ITO, $BaTiO_3$, $Nb_2O_5$, $In_2O_3$, $ZrO_2$, $Ta_2O_5$, $La_2O_3$, $SrTiO_3$, $Y_2O_3$, $Ho_2O_3$, $Bi_2O_3$, $CeO_2$, and $Al_2O_3$.

4. The electrolyte composition according to claim 3, wherein the $TiO_2$ is either one of or a mixture of titanium oxide nanotubes and titanium oxide nanoparticles.

5. The electrolyte composition according to claim 2, wherein the conductive particles comprises a material containing carbon as a main component.

6. The electrolyte composition according to claim 5, wherein the material containing carbon as a main component is one member or a mixture of two or more members selected from the group consisting of carbon nanotubes, carbon fibers, and carbon black.

7. The electrolyte composition according to claim 6, wherein the carbon nanotubes are either one of or a mixture of single-wall carbon nanotubes and multi-wall carbon nanotubes.

8. The electrolyte composition according to claim 2, wherein a total compounding amount of the oxide semiconductor particles and the conductive particles is not less than 0.05% by weight and not more than 70% by weight with respect to a total amount of the electrolyte composition.

9. The electrolyte composition according to claim 1, wherein a compounding amount of the oxide semiconductor particles is not less than 0.05% by weight and not more than 70% by weight with respect to the ionic liquid.

10. The electrolyte composition according to claim 2, wherein a total compounding amount of the oxide semiconductor particles and the conductive particles is not less than 0.05% by weight and not more than 70% by weight with respect to the ionic liquid.

11. A photoelectric conversion element comprising the electrolyte composition according to claim 1 contained as an electrolyte.

12. A photoelectric conversion element, comprising:
a working electrode, the working electrode comprising an electrode substrate and an oxide semiconductor porous film formed on the electrode substrate and sensitized with a dye;
a counter electrode disposed opposing the working electrode; and
an electrode layer made of the electrolyte composition according to claim 1 provided between the working electrode and the counter electrode.

13. A dye-sensitized photovoltaic cell, comprising:
a working electrode, the working electrode comprising an electrode substrate and an oxide semiconductor porous film formed on the electrode substrate and sensitized with a dye;
a counter electrode disposed opposing the working electrode; and
an electrode layer made of the electrolyte composition according to claim 1 provided between the working electrode and the counter electrode.

14. The electrolyte composition according to claim 5, wherein the material containing carbon as a main component includes carbon nanotubes, carbon fibers, carbon black, and the like.

15. The electrolyte composition according to claim 1, wherein a shift width of equilibrium potentials is not less than 18 mV and not more than 55 mV, the shift width of the equilibrium potentials being defined as {(an equilibrium potential of the redox pair in the electrolyte composition)−(an equilibrium potential of the redox pair in the liquid electrolyte)}.

* * * * *